(12) United States Patent
Kim et al.

(10) Patent No.: US 10,418,520 B2
(45) Date of Patent: Sep. 17, 2019

(54) LIGHT EMITTING DISPLAY DEVICE

(71) Applicant: LG Display Co., Ltd., Seoul (KR)

(72) Inventors: Soo-Kang Kim, Paju-si (KR); Won-Hoe Koo, Paju-si (KR); Ji-Hyang Jang, Paju-si (KR); So-Young Jo, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/023,930

(22) Filed: Jun. 29, 2018

(65) Prior Publication Data

US 2019/0006557 A1 Jan. 3, 2019

(30) Foreign Application Priority Data

Jun. 30, 2017 (KR) .................. 10-2017-0083798
Sep. 28, 2017 (KR) .................. 10-2017-0126431

(51) Int. Cl.
| | | |
|---|---|---|
| *H01L 33/20* | (2010.01) | |
| *H01L 33/58* | (2010.01) | |
| *H01L 27/12* | (2006.01) | |
| *H01L 33/50* | (2010.01) | |
| *H01L 51/00* | (2006.01) | |

(52) U.S. Cl.
CPC .......... *H01L 33/20* (2013.01); *H01L 27/1248* (2013.01); *H01L 33/505* (2013.01); *H01L 33/58* (2013.01); *H01L 51/00* (2013.01)

(58) Field of Classification Search
CPC ... H01L 33/486; H01L 33/502; H01L 33/505; H01L 33/507; H01L 33/54; H01L 33/56; H01L 2933/0041; H01L 2933/005; H01L 2115/10; H01L 35/505; H01L 33/62; C09K 11/70; F21Y 2115/10
See application file for complete search history.

(56) References Cited

U.S. PATENT DOCUMENTS

| | | | | |
|---|---|---|---|---|
| 6,831,718 | B2 * | 12/2004 | Wei | G02F 1/133555 349/106 |
| 7,450,201 | B2 * | 11/2008 | Ohue | G02F 1/133555 349/106 |
| 2017/0363915 | A1 * | 12/2017 | Song | G02F 1/133512 |

FOREIGN PATENT DOCUMENTS

| | | |
|---|---|---|
| KR | 10-2006-0055729 A | 5/2006 |
| KR | 10-2015-0077279 A | 7/2015 |
| KR | 10-2015-0121896 A | 10/2015 |
| KR | 10-2015-0123159 A | 11/2015 |
| KR | 10-2016-0137889 A | 12/2016 |

* cited by examiner

*Primary Examiner* — Zandra V Smith
*Assistant Examiner* — Andre C Stevenson
(74) *Attorney, Agent, or Firm* — Polsinelli PC

(57) ABSTRACT

A light emitting display device includes: a light emitting element that includes a light emitting layer between a first electrode and a second electrode; a wavelength conversion layer overlapping the light emitting element; and an uneven layer that includes a plurality of furrows between the light emitting element and the wavelength conversion layer, wherein a shortest distance between a bottom surface of the plurality of furrows and the wavelength conversion layer is 0.1 um or greater.

20 Claims, 13 Drawing Sheets

LIGHT EMITTING DISPLAY DEVICE

CROSS REFERENCE TO RELATED APPLICATION

The present application claims the priority benefit of Korean Patent Application Nos. 10-2017-0083798 and 10-2017-0126431 filed in Republic of Korea on Jun. 30, 2017 and Sep. 28, 2017, respectively, which are hereby incorporated by reference in their entirety for all purposes as if fully set forth herein.

BACKGROUND

Field of the Disclosure

The present disclosure relates to a light emitting display device.

Description of the Background

A light emitting display device has a high response speed and a low power consumption and is self-luminescent differently from a liquid crystal display device, and thus the light emitting display device has an advantage in viewing angle and receives attraction as a next generation display device.

The light emitting display device display images through an emission of a light emitting element that includes a light emitting layer between two electrodes.

However, since a part of a light emitted at the light emitting layer is not output to the outside due to a total reflection at an interface between the light emitting layer and the electrode or an interface between a substrate and an air, a light extraction efficiency of the light emitting display device can be reduced. Because of the low light extraction efficiency, the light emitting display device has problems that brightness can be reduced and a power consumption can be increased.

SUMMARY

Accordingly, the present disclosure is directed to a light emitting display device that substantially obviates one or more of the problems due to limitations and disadvantages of the related art.

In addition, the present disclosure is to provide a light emitting display device that can improve an extraction efficiency of a light emitted from a light emitting element.

Additional features and advantages of the disclosure will be set forth in the description which follows, and in part will be apparent from the description, or may be learned by practice of the disclosure. The advantages of the disclosure will be realized and attained by the structure particularly pointed out in the written description and claims as well as the appended drawings.

To achieve these and other advantages, and in accordance with the purpose of the present disclosure, as embodied and broadly described herein, a light emitting display device includes: a light emitting element that includes a light emitting layer between a first electrode and a second electrode; a wavelength conversion layer overlapping the light emitting element; and an uneven layer that includes a plurality of furrows between the light emitting element and the wavelength conversion layer, wherein a shortest distance between a bottom surface of the plurality of furrows and the wavelength conversion layer is 0.1 um or greater.

It is to be understood that both the foregoing general description and the following detailed description are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate aspects of the disclosure and together with the description serve to explain the principles of the disclosure.

In the drawings.

DETAILED DESCRIPTION

Reference will now be made in detail to aspects, examples of which are illustrated in the accompanying drawings. The same or like reference numbers may be used throughout the drawings to refer to the same or like parts.

Figure 1:
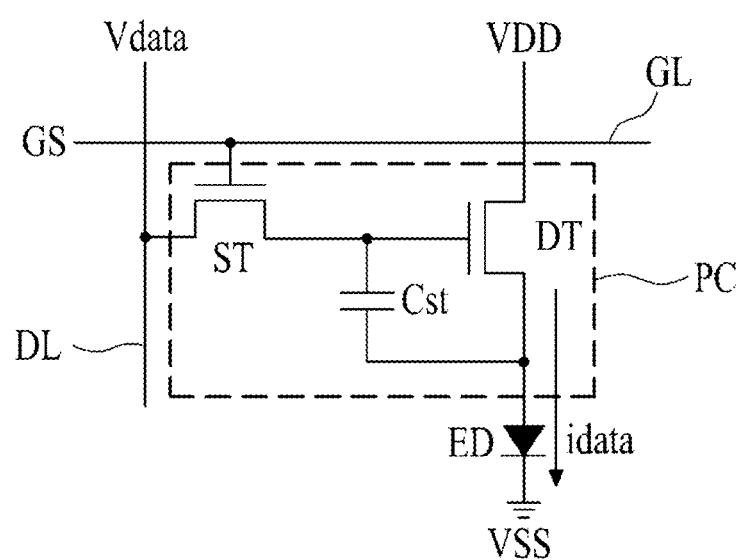
FIG. 1 is a circuit diagram illustrating a pixel region of a light emitting display device according to a first aspect of the present disclosure.

FIG. 1 is a circuit diagram illustrating a pixel region of a light emitting display device according to a first aspect of the present disclosure.

Referring to FIG. 1, a pixel region of a light emitting display device of a first aspect includes a pixel circuit PC and a light emitting element ED.

The pixel circuit PC is formed in a circuit region within the pixel region that is defined by a gate line GL and a data line DL, and is connected to the gate line GL, the data line DL and a first driving power source VDD. The pixel circuit PC responds to a gate on signal GS from the gate line GL to control an emission of the light emitting element ED according to a data voltage Vdata from the data line DL. The pixel circuit PC may include a switching thin film transistor (TFT) ST, a driving TFT DT, and a capacitor Cst.

The switching TFT ST includes a gate electrode connected to the gate line GL, a first source/drain electrode connected to the data line DL, and a second source/drain electrode connected to a gate electrode of the driving TFT DT. The switching TFT ST supplies the data voltage Vdata to the gate electrode of the driving TFT DT according to the gate on signal GS from the gate line GL.

The driving TFT includes the gate electrode connected to the second source/drain electrode of the switching TFT ST, a drain electrode connected to the first driving power source VDD, and a source electrode connected to the light emitting element ED. The driving TFT DT is turned on according to a gate-source voltage based on the data voltage Vdata, which is supplied from the switching TFT ST, and controls a data signal idata supplied from the first driving power source VDD to the light emitting element ED.

The capacitor Cst is connected between the gate electrode and the source electrode of the driving TFT DT to store a voltage corresponding to the data voltage Vdata supplied to the gate electrode of the driving TFT DT, and turns on the driving TFT DT with the stored voltage. The capacitor Cst maintains the turn-on state of the driving TFT DT until a data voltage Vdata is supplied through the switching TFT ST in a next frame.

The light emitting element ED is formed in a light emission region within the pixel region and emits a light according to the data signal idata supplied from the pixel circuit PC.

The light emitting element ED may include a first electrode connected to the source electrode of the driving TFT DT, a second electrode connected to a second driving power source VSS, and a light emitting layer between the first and second electrodes. The light emitting layer may include one of an organic light emitting layer, an inorganic light emitting layer and a quantum dot light emitting layer, or a stacked or mixed structure of an organic light emitting layer (or an inorganic light emitting layer) and a quantum dot light emitting layer.

The pixel region of this aspect controls the data signal idata, which is supplied to the light emitting element ED, according to the gate-source voltage of the driving TFT DT depending on the data voltage Vdata, and emits the light emitting element ED to display images.

Figure 2:
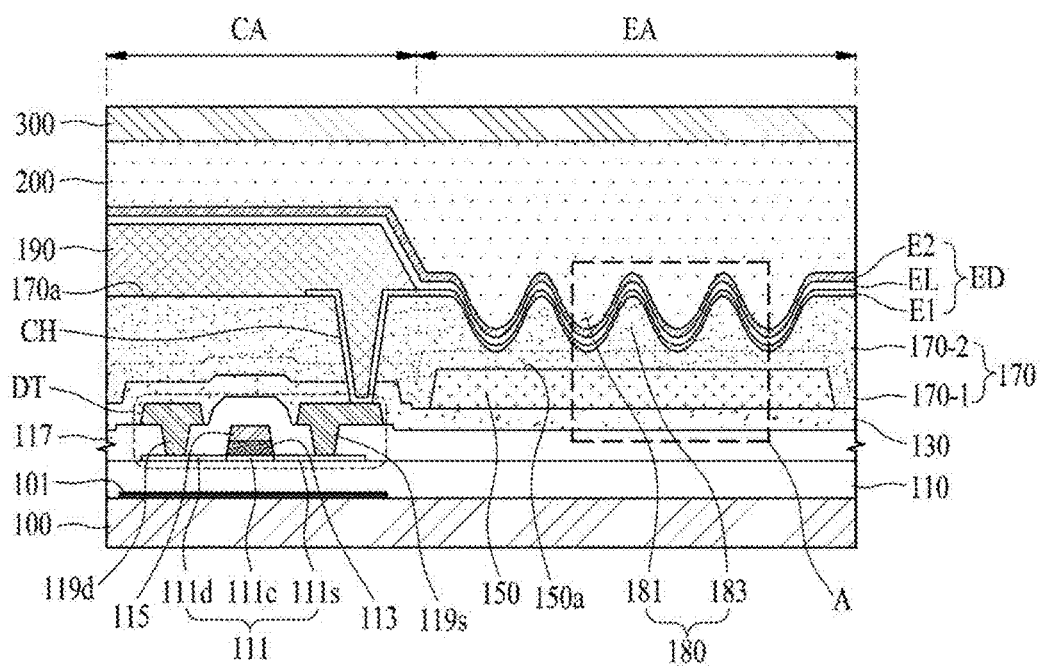
FIG. 2 is a cross-sectional view illustrating a pixel region according to the first aspect of the present disclosure.

FIG. 2 is a cross-sectional view illustrating the pixel region according to the first aspect of the present disclosure.

Referring to FIG. 2, the pixel region of this aspect includes the pixel region CA and the light emission region (or opening region) EA defined on a substrate 100.

The substrate 100 may be usually formed of a glass material, and alternatively, may be formed of a transparent plastic material having a bendable or flexible property, for example, polyimide material. In case that the plastic material is used for the substrate 100, considering that a deposition at high temperature is conducted, polyimide having an excellent heat-resisting property may be used. an entire surface of the substrate 100 may be covered by at least one buffer layer 110.

The buffer layer 110 serves to prevent a material contained in the substrate 100 diffusing to a transistor layer in a high-temperature process among manufacturing processes of a TFT. Further, the buffer layer 110 may serve to prevent an external moisture permeating to the light emitting element ED. The buffer layer 110 may be made of silicon oxide or silicon nitride. Alternatively, the buffer layer 110 may be omitted.

The circuit region CA includes a transistor layer, a first insulating layer 130 and a second insulating layer 170.

The transistor layer includes the driving TFT DT.

The driving TFT DT may include an active layer 111, a gate insulating layer 113, a gate electrode 115, a passivation layer 117, a drain electrode 119d, and a source electrode 119s.

The active layer 111 includes a channel region 111c, a drain region 111d and a source region 111s, which are formed at a TFT region of the circuit region CA defined on the substrate 100 or the buffer layer 110. The active layer 111 includes the drain region 111d and the source region 111s, which become conductive by an etching gas in an etching process of the gate insulating layer 113, and the channel region 111c which are not conductive. The drain region 111d and the source region 111s may be spaced apart from each other with the channel region 111c therebetween.

The active layer 111 may be made of a semiconductor material including, but not limited to, at least one of amorphous silicon, polycrystalline silicon, an oxide and an organic material. For example, the active layer 111 may be formed of an oxide, such as zinc oxide, tin oxide, Ga—In—Zn oxide, In—Zn oxide, or In—Sn oxide, or an oxide doped with an ion of Al, Ni, Cu, Ta, Mo, Zr, V, Hf or Ti.

The gate insulating layer 113 is formed on the channel region 111c of the active layer 111. The gate insulating layer 113 may not be formed over an entire surface of the substrate 100 or buffer layer 110, may be formed in an island shape only on the channel region 111c.

The gate electrode 115 is formed on the gate insulating layer 113 such that the gate electrode 115 overlaps the channel region 111c. The gate electrode 115 may serve as a mask such that the channel region 111c does not become conductive by an etching gas in a process of patterning the gate insulating layer 113 using an etching. The gate electrode 115 may be made of Mo, Al, Cr, Au, Ti, Ni, Nd, Cu, or an alloy thereof, and may be formed of a single-layered or multiple-layer structure using one of the above metals or an alloy of the above metals.

The passivation layer 117 may be formed on the gate electrode 115, and the drain region 111d and the source region 111s of the active layer 111. In other words, the passivation layer 117 may be formed over an entire surface of the substrate 100 or the buffer layer 110 to cover the gate electrode 115 and the drain and source regions 111d and 111s of the active layer 111. The passivation layer 117 may be made of an inorganic material such as silicon oxide (SiOx) or silicon nitride (SiNx), or an organic material such as benzocyclobutene or photo acryl. The passivation layer 117 may be referred to as an inter-layered insulating layer.

The drain electrode 119d is electrically connected to the drain region 111d through a first contact hole that is formed in the passivation layer 117 overlapping the drain region 111d.

The source electrode 119s is electrically connected to the source region 111s through a second contact hole that is formed in the passivation layer 117 overlapping the source region 111s.

The drain and source electrodes 119d and 119s are made of the same metal material, for example, Mo, Al, Cr, Au, Ti, Ni, Nd, Cu, or an alloy thereof, and may be formed of a single-layered or multiple-layer structure using one of the above metals or an alloy of the above metals.

Further, the circuit region CA includes a switching TFT and a capacitor.

The switching TFT is formed in the circuit region CA with the same structure as the driving TFT DT, and detailed explanations of the switching TFT are omitted.

The capacitor is formed at an overlapping region between the gate electrode 115 and the source electrode 119s of the driving TFT DT with the passivation layer 117 therebetween.

A TFT in the circuit region CA may have a property of a threshold voltage being shifted by a light, and to prevent this, the light emitting display device of this aspect may further include a light shielding layer 101 located below the active layer 111.

The light shielding layer 101 is formed between the substrate 100 and the active layer 111 and shields the active layer 111 from a light incident toward the active layer 111 through the substrate 100, and thus a threshold voltage change of a TFT by an external light is prevented. The light shielding layer 101 may be covered by the buffer layer 110. Selectively, the light shielding layer 101 may be connected to a source electrode of a TFT and serve as a bottom gate electrode of this TFT, and in this case, not only a property change by a light but also a threshold voltage change according to a bias voltage are minimized or prevented.

The first insulating layer 130 is formed on the substrate 100 to cover the transistor layer. In other words, the first insulating layer 130 covers the drain and source electrodes 119d and 119s and the passivation layer 117. The first insulating layer 130 may be made of an inorganic material such as silicon oxide or silicon nitride. The first insulating layer 130 may be referred to as a passivation layer.

The second insulating layer 170 is formed on the substrate 100 to cover the first insulating layer 130. The second insulating layer 170 is formed to have a relatively thick thickness and serves to provide a flat surface. The second insulating layer 170 may be made of an organic material such as photo acryl, benzocyclobutene, polyimide or fluorine resin.

The light emission region EA includes a wavelength conversion layer 150, an uneven layer 180, and a light emitting element ED.

The wavelength conversion layer 150 is formed on the first insulating layer 130 overlapping the light emission region EA. In other words, the wavelength conversion layer 150 is supported by the first insulating layer 130 and is covered by the second insulating layer 170 so that the wavelength conversion layer 150 is located between the first insulating layer 130 and the uneven layer 180 and overlaps the light emitting element ED.

The wavelength conversion layer 150 may include a color filter that transmits a wavelength of a color light, which is set (or defined) at its pixel region, out of a white light emitted from the light emitting element ED toward the substrate 100. Alternatively, the wavelength conversion layer 150 may transmits a wavelength of red, green or blue. For example, in the light emitting display device, one unit pixel may consist of neighboring first to third pixel regions, and in this case, a wavelength conversion layer of the first pixel region may include a red color filter, a wavelength conversion layer of the second pixel region may include a green color filter, and a wavelength conversion layer of the third pixel region may include a blue color filter. Further, in the light emitting display device, one unit pixel may include a white pixel region that has no wavelength conversion layer.

Alternatively, the wavelength conversion layer 150 may include a quantum dot that has a size to re-emit according to a white light emitted from the light emitting element ED toward the substrate 100 and output a light of a color set at its pixel region. The quantum dot may be selected from CdS, CdSe, CdTe, ZnS, ZnSe, CdZnSeS, GaAs, GaP, GaAs—P, Ga—Sb, InAs, InP, InSb, AlAs, AlP or AlSb. For example, a wavelength conversion layer of a first pixel region may include a quantum dot of CdSe or InP, a wavelength conversion layer of a second pixel region may include a quantum dot of CdZnSeS, a wavelength conversion layer of a third pixel region may include a quantum dot of ZnSe. The light emitting display device using the wavelength conversion layer 150 with a quantum dot can have a high color reproduction range.

Alternatively, the wavelength conversion layer 150 may be formed of a color filter containing a quantum dot.

The uneven layer 180 may be located at the second insulating layer 170 to have an uneven shape, and changes a traveling path of a light emitted from the light emitting element ED, and thus increases a light extraction efficiency of a pixel region. The uneven layer 180 includes a plurality of furrows 181 located between the light emitting element ED and the wavelength conversion layer 150. In other words, the uneven layer 180 may include a plurality of furrows 181 and a wall 183.

Each of the plurality of furrow 181 is formed concavely from a front surface (or top surface) 170a of the second insulating layer 170. With respect to the front surface 170a of the second insulating layer 170, each of the plurality of furrows 181 may have the same depth, and due to a manufacturing process error in a patterning process for the uneven layer 180, a part of the plurality of furrows 181 may have a different depth.

A bottom surface (or lowest surface) of each furrow 181 is separate at a predetermined distance from the wavelength conversion layer 150. In order that a front surface 150a of the wavelength conversion layer 150 being directly exposed to the furrows 181 due to the depth of the furrows 181 is prevented, a shortest distance from the bottom surface of the furrows 181 to the wavelength conversion layer 150 may be 0.1 um or greater. In this case, the second insulating layer 170 between the bottom surface of the furrows 181 and the wavelength conversion layer 150 may have a thickness of 0.1 um or greater. In case that the second insulating layer 170 between the bottom surface of the furrows 181 and the wavelength conversion layer 150 has a thickness less than 0.1 um, in a patterning process for the uneven layer 180, a part of the wavelength conversion layer 150 may be directly exposed to the furrow 181, and thus a property of the light emitting element ED formed on the uneven layer 180 may be deteriorated.

The wall 183 may have a structure to define or surround each furrow 181. The wall 183 changes a traveling path of a light from the light emitting element ED toward substrate 100 and increases an extraction efficiency of a light from the light emitting element ED.

The light emitting element ED may emit a light in a direction to the substrate 100 according to a bottom emission type. The light emitting element ED may include a first electrode E1, a light emitting layer EL, and a second electrode E2.

The first electrode E1 is formed on the uneven layer 180 of the light emission region EA and is electrically connected to the source electrode 119s of the driving TFT DT.

An end of the first electrode E1 adjacent to the circuit region CA extends over the source electrode 119s of the driving TFT DT, and is electrically connected to the source electrode 119s through a contact hole CH formed in the first and second insulating layers 130 and 170. The first electrode E1 directly contacts the uneven layer 180 and thus substantially has a shape according to the shape of the uneven layer 180.

The first electrode E1 may be an anode of the light emitting element ED. The first electrode E1 may be made of a transparent conductive material, for example, a transparent conductive oxide such as ITO or IZO.

The light emitting layer EL is formed on the first electrode E1 and directly contacts the first electrode E1, and thus the light emitting layer EL substantially has a shape according to the shape of the first electrode E1. Accordingly, the light emitting layer EL has a shape according to the shape of the uneven layer 180.

The light emitting layer EL may include at least two light emitting portions to emit a white light. For example, the light emitting layer EL may include a first light emitting portion and a second light emitting portion to emit a white light by a mixture of a first light and a second light. In this case, the first light emitting portion emits a first light and may include one of a blue light emitting portion, a green light emitting portion, a red light emitting portion, a yellow light emitting portion and a yellow-green light emitting portion. The second light emitting portion may include another one, which emits a light having a complementary color to the first light, out of a blue light emitting portion, a green light emitting portion, a red light emitting portion, a yellow light emitting portion and a yellow-green light emitting portion.

The second electrode E2 is formed on the light emitting layer EL and directly contacts the light emitting layer EL, and thus the second electrode E2 substantially has a shape according to the shape of the light emitting layer EL. Accordingly, the second electrode E2 has a shape according to the shape of the uneven layer 180.

The second electrode E2 may be a cathode of the light emitting element ED. The second electrode E2 may include a metal material having a high reflectance to reflect a light from the light emitting layer EL toward the substrate 100.

For example, the second electrode E2 may have a multiple-layered structure, such as a stacked structure with Al and Ti (e.g., Ti/Al/Ti), a stacked structure with Al and ITO (e.g., ITO/Al/ITO), an APC(Ag/Pd/Cu) alloy or a stacked structure with APC alloy and ITO (e.g., ITO/APC/ITO), or have a single-layered structure using Ag, Al, Mo, Au, Mg, Ca, Ba, or an alloy thereof.

The light emitting element ED emits a white light by an emission of the light emitting layer EL according to a data signal supplied to the first electrode E1. The light emitting element ED has a shape according to the shape of the uneven layer 180. Accordingly, among a white light incident on an interface between the first electrode E1 and the uneven layer 180, a light having an incident angle equal to or less than a critical angle of a total reflection is directly extracted to the substrate 100, and a light having an incidence angle greater than the critical angle changes in its traveling path by the furrow 181 and the wall 183 of the uneven layer 180 and is then extracted to the substrate 100. Accordingly, in this aspect, a light extraction efficiency of each pixel region can increase.

The light emitting display device may further include a bank layer 190 and an encapsulation layer 200.

The bank layer 190 defines the light emission region EA, and may be formed on an edge of the first electrode E1 and the second insulating layer 170. The bank layer 190 may be made of an organic material such as a benzocyclobutene (BCB) based resin, an acryl based resin, or a polyimide based resin. Alternatively, the bank layer 190 may be made of a photosensitive material containing a black pigment, and in this case, the bank layer 190 serves as a light shielding member.

The light emitting layer EL and the second electrode E2 may be formed on the bank layer 190. In other words, the light emitting layer EL may be formed on the substrate 100 having the first electrode E1 and the bank layer 190, and the second electrode E2 may be formed to cover the light emitting layer EL.

The encapsulation layer 200 is formed on the substrate 100 to cover the second electrode E2 i.e., to cover all pixel regions. The encapsulation layer 200 protects the TFTs and the light emitting element ED from an external impact, and prevents moisture permeating the light emitting element ED.

Selectively, the encapsulation layer 200 may be replaced with a filling material surrounding all pixel regions, and in this case, the light emitting display device may further include an encapsulation substrate 300 that is adhered onto the substrate 100 through the filling material. The encapsulation substrate 300 may be made of a metal material.

Further, the light emitting display device of this aspect may include a polarizing film that is adhered on a bottom surface (or a light extraction surface) of the substrate 100. The polarizing film changes an external light reflected by a TFT and/or a line formed in a pixel region into a circularly-polarized light and thus improves visibility and contrast ratio.

In the light emitting display device of this aspect, by the uneven layer 180 at the light emission region EA of the pixel region, a traveling path of a light from the light emitting element ED changes thus a light extraction efficiency can be improved, and thus a brightness can be improved and a power consumption can be reduced. Further, since a shortest distance between the uneven layer 180 and the wavelength conversion layer 150 is set to be 0.1 um or greater, the wavelength conversion layer 150 being exposed directly to the furrow 181 can be prevented, and thus a property degradation of the light emitting element ED can be prevented.

Figure 3:
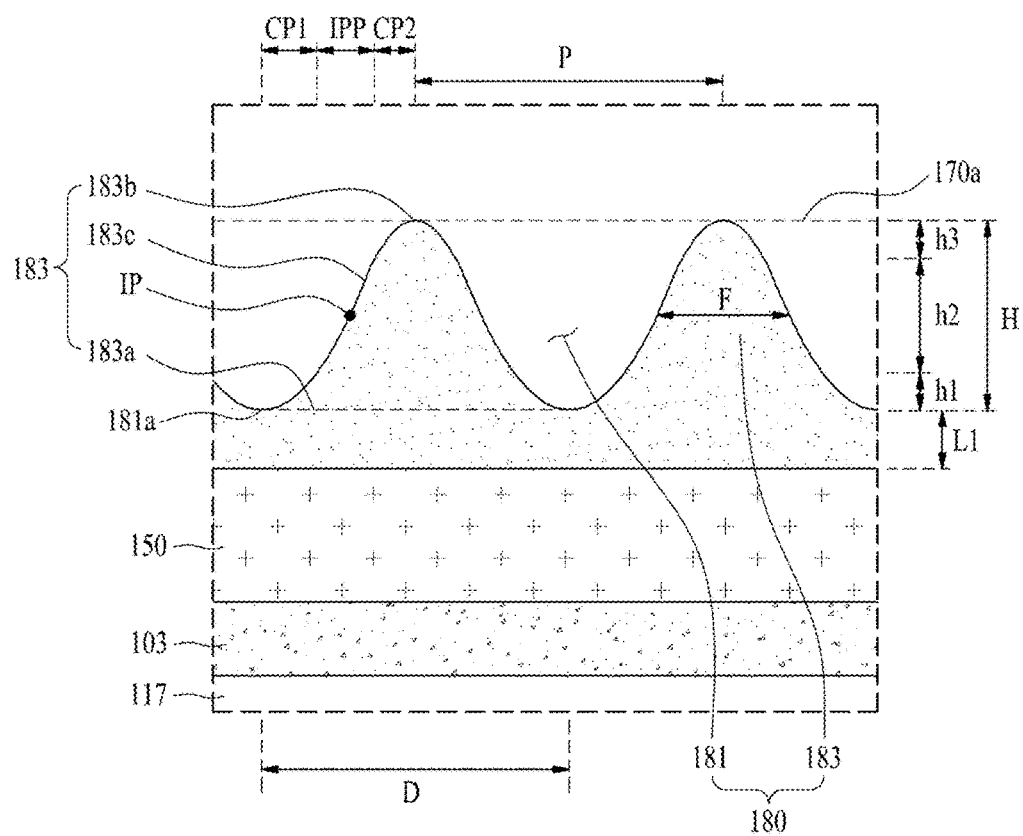
FIG. 3 is a view enlarging a portion A of FIG. 2.
Figure 4:
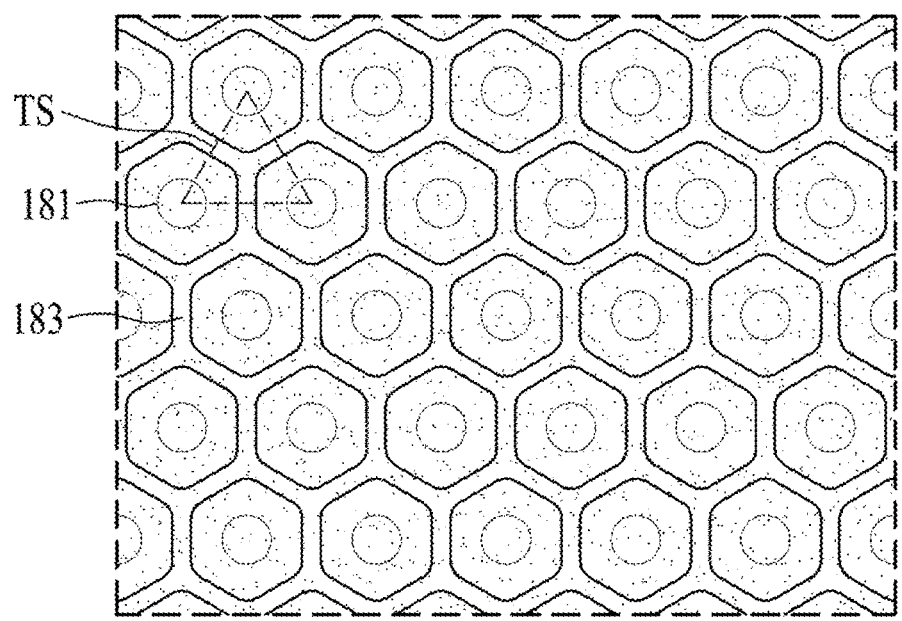
FIG. 4 is a plan view illustrating a plan structure of an uneven layer of FIG. 2.

FIG. 3 is a view enlarging a portion A of FIG. 2 to explain a cross-sectional structure of the uneven layer of this aspect. FIG. 4 is a plan view illustrating a plan structure of the uneven layer of FIG. 2.

Referring to FIGS. 2 to 4, the uneven layer 180 includes a plurality of furrows 181 and a wall 183 defining each furrow 181.

Each of the plurality of furrows 181 are provided concavely from a front surface 170a of the second insulating layer 170 to have a regular interval, and may be referred to as a concave portion or dent portion.

The furrows 181 may be arranged in a line along a first direction and be arranged in a zigzag shape along a second direction such that the furrows 181 are located at regular intervals. In other words, while the furrows 181 may be arranged in a lattice form having a regular interval, adjacent furrows 181 along a second direction may be arranged alternately. Accordingly, centers of three adjacent furrows 181 may form a triangle shape TS.

The furrows 181 may substantially have the same depth with respect to the front surface 170a of the second insulating layer 170. Due to a manufacturing process error in a patterning process for the uneven layer 180, a part of the furrows 181 may have a different depth.

A bottom surface (or lowest surface) 181a of each furrow 181 is separate at a predetermined distance from the wavelength conversion layer 150. In other words, the bottom surface 181a of the furrow 181 faces a front surface 150a of the wavelength conversion layer 150 with the second insulating layer 170 therebetween. The second insulating layer 170 located between the bottom surface 181a of the furrows 181 and the wavelength conversion layer 150 may have a thickness of 0.1 um or greater in order that a part of the front surface 150a of the wavelength conversion layer 150 being directly exposed to the furrows 181 when forming the furrows 181 is prevented. When forming the furrows 181, as the second insulating layer 170 between the bottom surface 181a of the furrows 181 and the wavelength conversion layer 150 increases in thickness, a part of the front surface 150a of the wavelength conversion layer 150 being directly exposed to the furrows 181 is effectively prevented, but in terms of a manufacturing process, a material cost and a process time of the second insulating layer 170 and a thickness of the light emitting display device increases. Accordingly, in order that the front surface 150a of the wavelength conversion layer 150 being directly exposed to the furrows 181 due to the depth of the furrows 181 is prevented and also an increase of a material cost and a process time of the second insulating layer 170 and a thickness of the light emitting display device is minimized, a maximum thickness of the second insulating layer 170 between the bottom surface 181a of the furrow 181 and the wavelength conversion layer 150 may be set to be 3 um or less. Thus, among the plurality of furrows 181, a shortest distance L1 from the front surface 150a of the wavelength conversion layer 150 may be 0.1 um, and a longest distance from the front surface 150a of the wavelength conversion layer 150 may be 3 um. As a result, a distance L1 between the bottom surface 181a of each furrow 181 and the front surface 150a of the wavelength conversion layer 150 may be in a range of 0.1 um to 3 um.

In case that the shortest distance L1 is less than 0.1 um, in a patterning process for the uneven layer 180, a part of the front surface 150a of the wavelength conversion layer 150 may be removed thus dented, or may be directly exposed to the furrow 181. In cast that the wavelength conversion layer 150 is not covered by the second insulating layer 170 and is exposed to the furrow 181, a dark spot defect happens at a dented portion of the wavelength conversion layer 150, a moisture or the like by an outgassing of the wavelength conversion layer 150 is diffused to the light emitting element ED thus property, reliability and lifetime of the light emitting element ED is reduced, the first electrode E1 is deteriorated due to the first electrode E1 directly contacting the wavelength conversion layer 150, and the wavelength conversion layer 150 is damaged by the deterioration of the first electrode E1. Thus, in case that the wavelength conversion layer 150 is not covered by the second insulating layer 170 and is exposed to the furrow 181, light emission property and lifetime of the light emitting display device may be reduced.

In this aspect, when forming the uneven layer 180 in the second insulating layer 170 overlapping the light emission region EA, in order to prevent a part of the front surface 150a of the wavelength conversion layer 150 being exposed to the furrow 181, the second insulating layer 170 is formed with a first layer (or first sub layer) 170-1 and a second layer (or second sub layer) 170-2. In other words, using the same organic insulating material, the second insulating layer 170 is configured with a double-layered structure that has two layers, formed sequentially, of different thicknesses.

The first layer 170-1 is formed to cover the first insulating layer 130 and the wavelength conversion layer 150 and serves as an exposure prevention layer or sacrificial layer to prevent an exposure of the wavelength conversion layer 150. The first layer 170-1 is formed to have a thickness of 0.1 um to 3 um thus separate the bottom surface 181a of each furrow 181 from the front surface 150a of the wavelength conversion layer 150 at a distance of 0.1 um to 3 um. Accordingly, when forming the uneven layer 180, the front surface 150a of the wavelength conversion layer 150 being exposed directly to the furrow 181 is prevented.

The second layer 170-2 is formed to entirely cover the first layer 170-1 and have a thickness greater than that of the first layer 170-1. The second layer 170-2 provides a planarization layer on the first layer 170-1 of the circuit region CA and the light emission region EA. For example, the second layer 170-2 has a thickness equal to or greater than a depth of the furrow 181 or a height H of the wall 183.

The second insulating layer 170 structurally includes the first layer 170-1 and the second layer 170-2 in order to prevent an exposure of the front surface 150a of the wavelength conversion layer 150. However, the first layer 170-1 is formed through a first deposition process and a first hardening process using an organic material, and then the second layer 170-2 is formed through a second deposition process and a second hardening process using the same organic material. Accordingly, a boundary portion between the first layer 170-1 and the second layer 170-2 of the double-layered structure formed on the circuit region CA of the substrate 100 may be not structurally distinguished.

The wall 183 surrounds each furrow 181 to define each furrow 181, and may have a structure protruded in a convex shape on the wavelength conversion layer 150. Accordingly, the wall 183 may have a cross-sectional structure of a convex lens shape or micro lens shape. The wall 183 changes a traveling path of a light, which is emitted from the light emitting element ED and is incident to the wall 183, toward the substrate 100, and thus a light extraction efficiency of the pixel region increases.

The wall 183 may have a hexagonal band shape in a plan view. One furrow 181 may be placed in the hexagonal band shaped wall 183. Accordingly, the furrows 181 and the wall 183 on the light emission region EA form a honeycomb structure of a hexagonal shape in a plan view. However, in this aspect, it should be understood that the wall 183 defining one furrow 181 may have a various shape in a plan view, for example, a circular band shape, an oval band shape, or polygonal band shape.

The wall 183 has a cross-sectional area that is alongside of (or parallel to) the wavelength conversion layer 150. In order to change a traveling path of an incident light and increase light extraction efficiency, the cross-sectional area of the wall 183 may become greater as the cross-section area may become closer to the wavelength conversion layer 150. In other words, the wall 183 may decrease in width in an upward direction (i.e., in a direction from the substrate 100 to the light emitting element ED).

The wall 183 may include a base surface portion 183a, a top portion 183b, and a side surface portion 183c.

The base surface portion 183a may be defined as a bottom surface of the wall 183 close to the wavelength conversion layer 150. In other words, the base surface portion 183a may be defined as a contact surface between the first layer 170-1 overlapping the wavelength conversion layer 150 and the wall 183, or a bottom surface of the wall 183 contacting the front surface of the first layer 170-1.

A diameter (or width) D of the base surface portion 183a may be set according to an aspect ratio (or height to width ratio) of the wall 183 based on a height H of the wall 183 and the diameter D within a range such that the base surface portion 183a has a size greater than the top portion 183b. The aspect ratio of the wall 183 may be defined as a value that is the height H of the wall 183 divided by half the diameter D/2 of the base surface portion 183a.

The base surface portions 183a of adjacent walls 183 may be connected to each other and form the bottom surface 181a of the furrow 181. In this case, a pitch P between the adjacent walls 183 may be set to be equal to the diameter D.

Alternatively, the base surface portions 183a of the adjacent walls 183 may be separate from each other, and in this case, the bottom surface 181a of the furrow 181 may be the first layer 170-1 exposed between the base surface portions 183a of the adjacent walls 183. A pitch P between the adjacent walls 183 is set to be greater than the diameter D, and the base surface portions 183a of adjacent walls 183 are separate from each other with a gap therebetween.

In case that the gap is formed between the adjacent walls 183, when forming the furrow 181, even though a misalign due to a deformation of a photo mask happens, the uneven layer 180 can be formed without an exposure of the wavelength conversion layer 150, and thus a process margin for the uneven layer 180 can increase.

The top portion 183b is separate at a predetermined height from the base surface portion 183a. The top portion 183b may be defined as a peak of the wall 183 having a convex shape. The top portion 183b may be located at the front surface 170a of the second insulating layer 170 or located below the front surface 170a.

The side surface portion 183c is located between the base surface portion 183a and the top portion 183b.

The side surface portion 183c may be formed in a curved shape between the base surface portion 183a and the top portion 183b in order to change a traveling path of an incident light thus increase a light extraction efficiency. The side surface portion 183c may have a curve shape with an inflection point IP in order to maximize a light extraction efficiency. In this case, the side surface portion 183c may include an inflection portion IPP including the inflection point IP, a first curved portion CP1 between the inflection portion IPP and the base surface portion 183a, and a second curved portion CP2 between the inflection portion IPP and the top portion 183b.

The inflection portion IPP may include a concave portion between the inflection point IP and the first curved portion CP1 and a convex portion between the inflection point IP and the second curved portion CP2. Accordingly, a traveling path of a light incident on the inflection portion IPP can change at various angles by each of the concave portion and the convex potion, and thus a light extraction efficiency of the pixel region can be improved.

The first curved portion CP1 may be formed in a concave shape between the inflection portion IPP and the base surface portion 183a. The second curved portion CP2 may be formed in a convex shape between the inflection portion IPP and the top portion 183b.

With respect to the height H of the wall 183, a ratio of a height h1 of the first curved portion CP1, a height h2 of the inflection portion IPP and a height h3 of the second curved portion CP2 may be set as, but not limited to, 1:3:1, and the height h1 of the first curved portion CP1 and the height h3 of the second curved portion CP2 may be equal to or different from each other while the heights h1 and h3 are less than the height h2 of the inflection portion IPP. Further, with respect to a length of the side surface portion 183c, a curved length of the inflection portion IPP may be greater than that of each of the first and second curved portions CP1 and CP2, a curved length of the first curved portion CP1 and a curved length of the second curved portion CP2 may be equal to or different from each other. The curved length of the second curved portion CP2 may be greater than that of the first curved portion CP1. The heights h1, h2 and h3 and the curved lengths of the first curved portion CP1, the inflection portion IPP and the second curved portion CP2 may be determined according to the aspect ratio of the wall 183 that is determined to improve a light extraction efficiency according to a change of a light traveling path.

The inflection portion IPP, the first curved portion CP1 and the second curved portion CP2 of the side surface portion 183c may have a symmetrical structure with respect to the top portion 183b, and thus the wall 183 may have a bell or Gaussian curve cross-sectional structure.

Alternatively, the side surface portion 183c may have a concave or convex curved shape such that the side surface portion 183c has any curvature between the base surface portion 183a and the top portion 183b.

Figure 5:
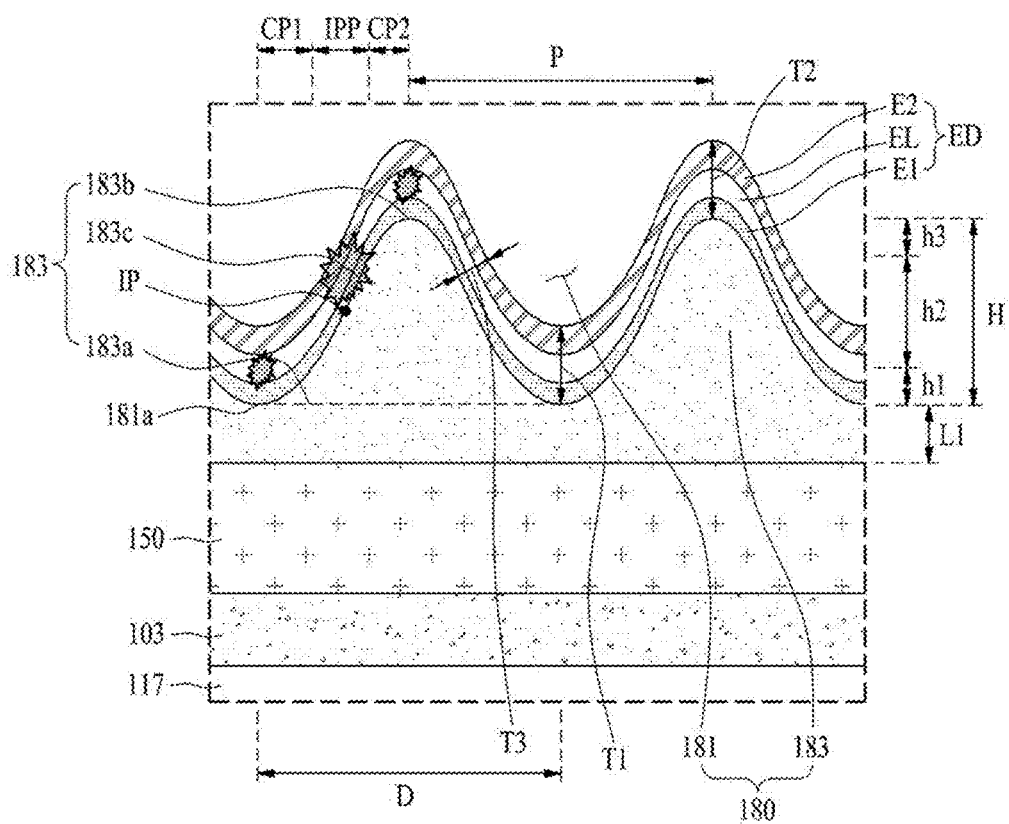
FIG. 5 is a view enlarging a portion A of FIG. 2.
Figure 6:
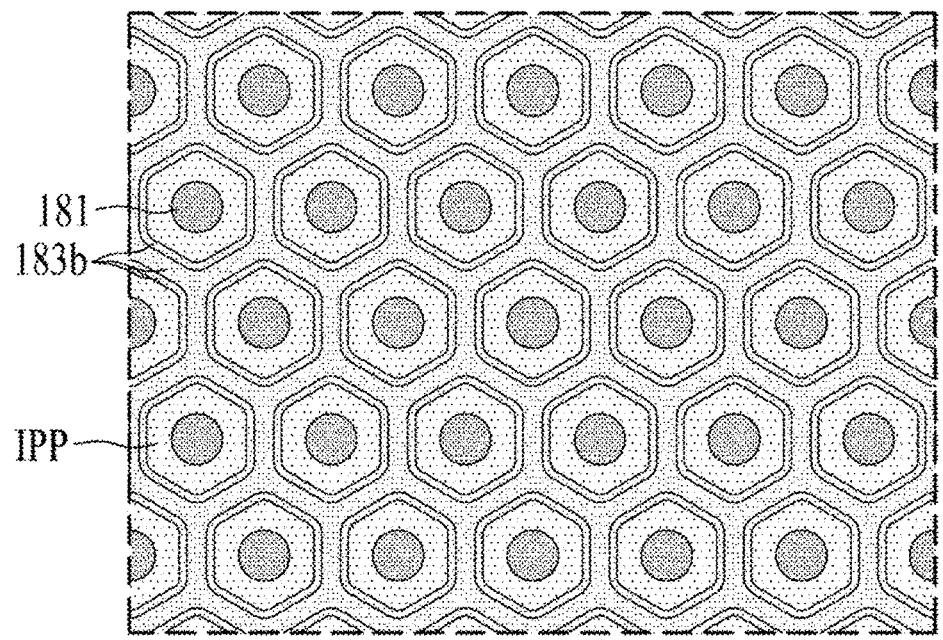
FIG. 6 is a plan view illustrating an emission brightness at an uneven layer of FIG. 2.

FIG. 5 is a view enlarging a portion A of FIG. 2 to explain a cross-sectional structure of the uneven layer and the light emitting element of this aspect. FIG. 6 is a plan view illustrating emission brightness at the uneven layer of FIG. 2.

Referring to FIGS. 2, 5 and 6, the light emitting element ED includes the first electrode E1, the light emitting layer EL and the second electrode E2 which are stacked sequentially. The light emitting element ED is formed to have a shape according to the shape of the furrows 181 and the wall 183 of the second insulating layer 170, and thus a traveling path of a light from the light emitting element ED changes toward the substrate 100 by the uneven layer 180 and a light extraction efficiency can increase.

The light emitting element ED may have different thicknesses according to formation positions on the furrow 181 and the wall 183. In detail, in a process of forming the light emitting element ED using a deposition method, a deposition material of the light emitting element ED has straightness, and is deposited on the uneven layer 180 not on an even surface. Accordingly, the light emitting element ED is formed on the uneven layer 180 to have a shape according to the shape of the furrow 181 and the wall 183, and thus the light emitting element ED may have different thicknesses T1, T2 and T3 at the furrow 181, the top portion 183b and the inflection portion IPP, respectively. In other words, each of the bottom surface 181a of the furrow 181 and the top portion 183b has a curvature greater than that of the inflection portion IPP, or has a slope less than that of the inflection portion IPP with respect to the base surface portion 183a. Accordingly, the light emitting element ED may have a first thickness T1 on the bottom surface 181a of the furrow 181, a second thickness T2, which is equal to or different from the first thickness T1, on the top portion 183b, and a third thickness T3, which is less than each of the first and second thicknesses T1 and T2, on the inflection portion IPP.

In case that the light emitting layer EL is formed as an organic light emitting layer, an emission of the light emitting layer EL is produced mostly at a region having a high current density. In the light emitting element ED of this aspect, a relatively strong main emission is produced at the relatively thin light emitting layer EL of the third thickness T3 on the inflection portion IPP, a first sub emission less than the main emission is produced at the relatively thick light emitting layer EL of the first thickness T1 greater than the third thickness T3 on the bottom surface 181a of the furrow 181, and a second sub emission less than the main emission is produced at the relatively thick light emitting layer EL of the second thickness T2 greater than the third thickness T3 on the top portion 183b. According to the shape of the uneven layer 180, a region where the main emission is produced may be defined as a main light extraction region, and a region where the sub emission is produced may be defined as a sub light extraction region. Accordingly, as shown in FIG. 6, regarding brightness over the uneven layer 180, a region overlapping the inflection portion IPP has a relatively high brightness, and a region overlapping the bottom surface 181a has a relatively low brightness.

Considering the thickness of the light emitting element ED formed according to the shape of the uneven layer 180, the top portion 183b of the wall 183 may serve as a sub emission region and have a high light extraction efficiency but a low current density. The bottom surface 181a of the furrow 181 may serve as a sub emission region and have a lowest light extraction efficiency and a lowest current density. The inflection portion IPP of the wall 183 may serve as a main emission region and have a high light extraction efficiency and a high current density. Accordingly, with respect to an emission amount of the light emitting element ED per unit area, an emission amount on the inflection portion IPP may be relatively greatest, an emission amount on the bottom surface 181a may be relatively smallest, and an emission amount on the top portion 183b may be equal to or greater than the emission amount on the bottom surface 181a.

Accordingly, regarding the side surface portion 183c of the wall 183, as a ratio occupied by the inflection portion IPP is greater, a light extraction efficiency may be greater, and as a ratio occupied by the first curved portion CP1 is less, a power consumption may be less. Thus, since the wall 183 is configured such that a ratio (h1:h2:h3) the height h1 of the first curved portion CP1, the height h2 of the inflection portion IPP and the height h3 of the second curved portion CP2 is set as 1:3:1 with respect to the height H of the wall 183, a light extraction efficiency can increase.

Through the shape of the uneven layer 180, a light extraction efficiency is influenced by the aspect ratio of the wall 183 based on the height H and the diameter D of the base surface portion 183a. Accordingly, the aspect ratio of the wall 183 is determined in a range of 0.4 to 0.7 in order to increase a light extraction efficiency.

The case that the aspect ratio of the wall 183 is in a range of 0.4 to 0.7 has a light extraction efficiency greater than that of the case that the aspect ratio is below 0.4 or over 0.7. In other words, in case that the aspect ratio of the wall 183 is below 0.4, the height H of the wall 183 is very low, thus an incident light from the light emitting element ED does not travel to the substrate but is trapped in the light emitting element ED, and thus a light extraction efficiency is reduced. In case that the aspect ratio of the wall 183 is over 0.7, the height H of the wall 183 is very high, thus an incident light from the light emitting element ED does not travel to the substrate but is trapped in the wall 183, and thus a light extraction efficiency is reduced. Particularly, in case that the aspect ratio is over 0.7, there is a tendency for an enhancement of a current efficiency of the light emitting element ED to be reduced, and in case that the aspect ratio is in a range of 0.4 to 0.7, a current efficiency enhancement of the light emitting element ED becomes a maximum value. Thus, it is preferable that the aspect ratio of the wall 183 is set in a range of 0.4 to 0.7 in order to maximize a light extraction efficiency of the pixel region.

In case that the aspect ratio of the wall 183 is in a range of 0.4 to 0.7, the diameter D of the base surface portion 183a may be set in a range of 4 um to 12 um based on a resolution of a mask to form the uneven layer 180. When the diameter D of the base surface portion 183a is 4 um and the height H of the wall 183 is 0.8 um, the wall 183 has the aspect ratio of 0.4. When the diameter D of the base surface portion 183a is 12 um and the height H of the wall 183 is 4.2 um, the wall 183 has the aspect ratio of 0.7. In case that the height H of the wall 13 is below 0.8, the aspect ratio is reduced thus a current efficiency enhancement may be reduced, and an amount of a light, emitted from the light emitting element ED, multiple reflected by the wall 183 increases thus an amount of a light extracted to the substrate is reduced. In case that the height H of the wall is over 4.2, the aspect ratio increases thus a current efficiency enhancement may be reduced.

Accordingly, in this aspect, in order for the aspect ratio of the wall 183 to be in a range of 0.4 to 0.7, the diameter D of the base surface portion 183a is set in a range of 4 um to 12 um and the height H of the wall 183 is set in a range of 0.8 um to 4.2 um, and thus a light extraction efficiency of the pixel region can be maximized.

Further, a full width at half maximum (or a full width at half height) F of the wall 183 may be set in a range of 1 um to 2.5 um. The full width at half maximum F means a full width at half a height (2/H) of the wall 183. In case that the full width at half maximum F of the wall 183 is below 1 um or over 2.5 um, a light extraction efficiency by the wall 183 may be reduced. In case that the full width at half maximum F of the wall 183 is below 1 um, an amount of a light, from the light emitting element ED, reflected by the wall 183 and then extracted to the substrate is less than an amount of a light diffuse reflected at the wall 183, thus an amount of a light trapped in the light emitting element ED increases and thus a light extraction efficiency may be reduced.

Particularly, a light, which has an incidence angle less than a critical angle of a total reflection, out of a light emitted from the light emitting element ED may be extracted to the outside of the substrate through a multiple reflection between the side surface portions 183c of the wall 183. In case that the full width at half maximum F of the wall 183 exceeds 2.5 um, an amount of a light reflected between the side surface portions 183c is reduced and thus an amount of a light output to the outside of the substrate is reduced.

In this aspect, by raising a ratio occupied by the inflection portion IPP that becomes a main emission region, out of regions of the wall 183 formed at the uneven layer 180, due to a thin thickness of the light emitting element ED, an extraction efficiency of a light emitted from the light emitting element ED can increase. Further, by the aspect ratio of the wall 183 being set in a range of 0.4 to 0.7, a current efficiency enhancement is raised and thus a power consumption can be reduced. Further, by the full width at half maximum F of the wall 183 being set in a range of 1 um to 2.5 um, an extraction efficiency of a light emitted from the light emitting element ED can increase. As a result, a light extraction efficiency of each pixel region can increase.

Figure 7:
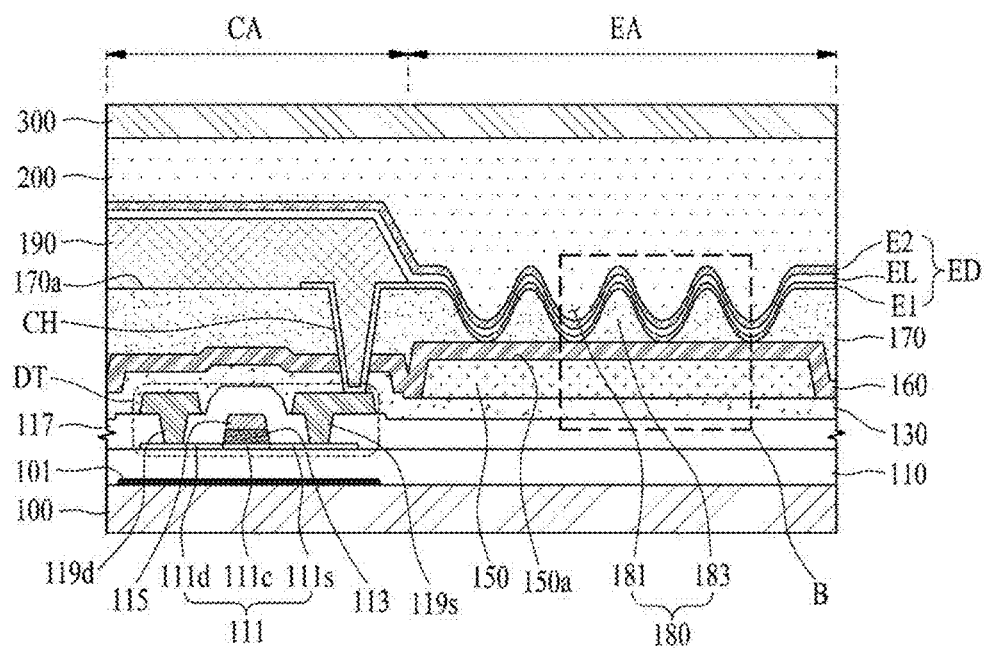
FIG. 7 is a cross-sectional view illustrating a pixel region according to the first aspect of the present disclosure.
Figure 8:
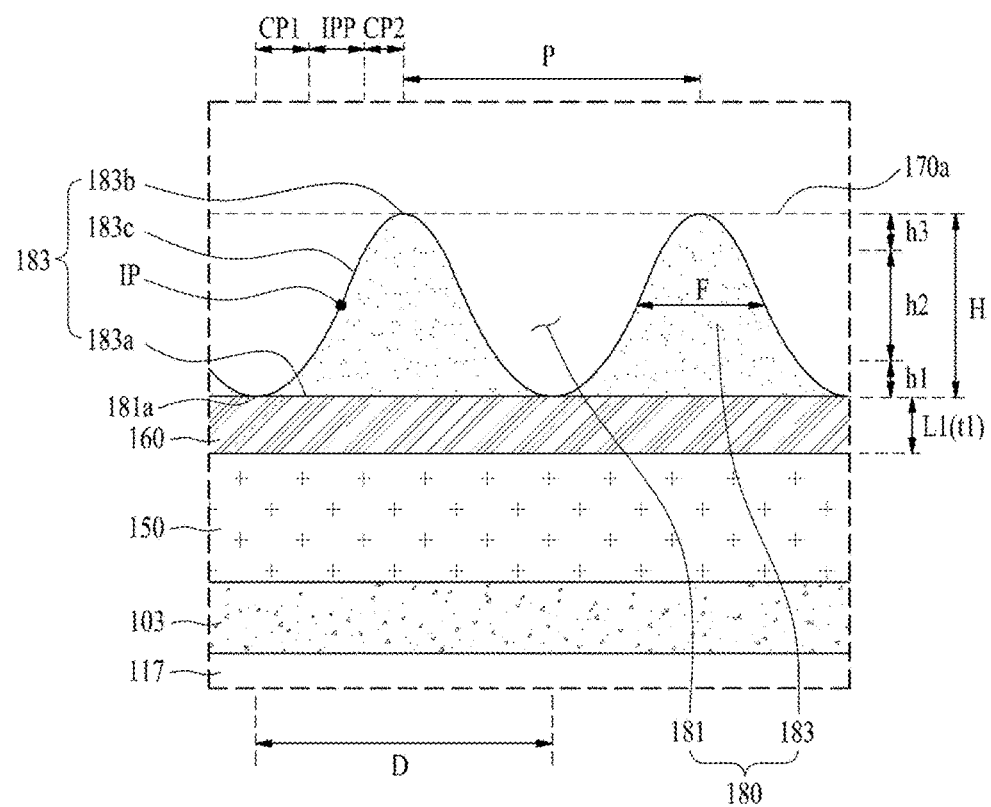
FIG. 8 is a view illustrating a cross-sectional structure of an uneven layer at a portion B of FIG. 7.

FIG. 7 is a cross-sectional view illustrating the pixel region according to the first aspect of the present disclosure. FIG. 8 is a view illustrating a cross-sectional structure of the uneven layer at a portion B of FIG. 7. The light emitting display device of FIGS. 7 and 8 further includes a barrier layer 160 in the pixel region. For the purpose of explanations, a barrier layer and relevant components are explained below, and explanations of the similar or same parts described above may be omitted.

Referring to FIGS. 7 and 8, the barrier layer 160 is formed to cover the wavelength conversion layer 150. In other words, the barrier layer 160 is provided between the uneven layer 180 and the wavelength conversion layer 150. Further, the barrier layer 160 covers a front surface 150a and side surfaces of the wavelength conversion layer 150 and the first insulating layer 130 at the light emission region EA and the circuit region CA. Accordingly, the barrier layer 160 overlapping the wavelength conversion layer 150 is between the bottom surface 181a of the furrows 181 and the wavelength conversion layer 150, and is between the base surface portion 183a of the wall 183 and the wavelength conversion layer 150. Further, the barrier layer 160 not overlapping the wavelength conversion layer 150 is between the first insulating layer 130 and the second insulating layer 170. The barrier layer 160 serves as an etch stopper on the wavelength conversion layer 150 when forming the uneven layer 180, thus the wavelength conversion layer 150 being exposed directly to the furrow 181 is prevented, and thus a problem by an exposure of the wavelength conversion layer 150 is fundamentally prevented.

The barrier layer 160 may have a thickness t1 that corresponds to the shortest distance L1 between the bottom surface 181a of the furrows 181 and the wavelength conversion layer 150. In other words, the barrier layer 160 may be formed at the thickness t1 of 0.1 um to 3 um to prevent the wavelength conversion layer 150 being exposed to the furrow 181 when forming the uneven layer 180.

In case that the barrier layer 160 has the thickness t1 less than 0.1 um, wavelength conversion particles in the wavelength conversion layer 150 penetrates the barrier layer 160 and damages the light emitting element ED. Further, as the thickness t1 of the barrier layer 160 increases, an exposure of the wavelength conversion layer 150 is prevented effectively, but in terms of a manufacturing process, a material cost and a process time of the barrier layer 160 and a thickness of the light emitting display device increases. Accordingly, in order that when forming the uneven layer 180, the barrier layer 160 serves as an etch stopper on the wavelength conversion layer 150 and also an increase of a material cost and a process time of the barrier layer 160 and a thickness of the light emitting display device is minimized, the barrier layer 160 is preferably formed to have the thickness t1 of 0.1 um to 3 um. For example, in case that the wavelength conversion particle of the wavelength conversion layer 150 has a size less than 0.1 um, the barrier layer 160 may be formed to have the thickness t1 of at least 0.1 um.

The barrier layer 160 may be formed of a material not removed by a developing material (or an etching material) that is used in a patterning process of the second insulating layer 170.

Alternatively, the barrier layer 160 may be formed of an inorganic material, for example, silicon oxide or silicon nitride. In other words, the barrier layer 160 may be formed of the same material as the first insulating layer 130, and in this case, the barrier layer 160 and the first insulating layer 130 may be formed of silicon oxide.

After forming the uneven layer 180, a process of forming the contact hole CH exposing a part of the source electrode 119s of the driving TFT DT may be conducted. Considering the forming process of the contact hole CH, in case that the barrier layer 160 is made of the same material as the first insulating layer 130, the contact hole CH can be formed in the barrier layer 160 and the first insulating layer 130 through one patterning process. Accordingly, to simplify manufacturing processes of the light emitting display device, the barrier layer 160 is preferably made of the same material as the first insulating layer 130.

In the light emitting display device of this aspect, by the uneven layer 180 at the light emission region EA of the pixel region, a traveling path of a light from the light emitting element ED changes thus a light extraction efficiency can be improved, and thus a brightness can be improved and a power consumption can be reduced.

Further, since the barrier layer 160 is formed as an etch stopper between the uneven layer 180 and the wavelength conversion layer 150, the wavelength conversion layer 150 being exposed directly to the furrow 181 can be prevented, and thus a property degradation of the light emitting element ED can be prevented.

Figure 9:
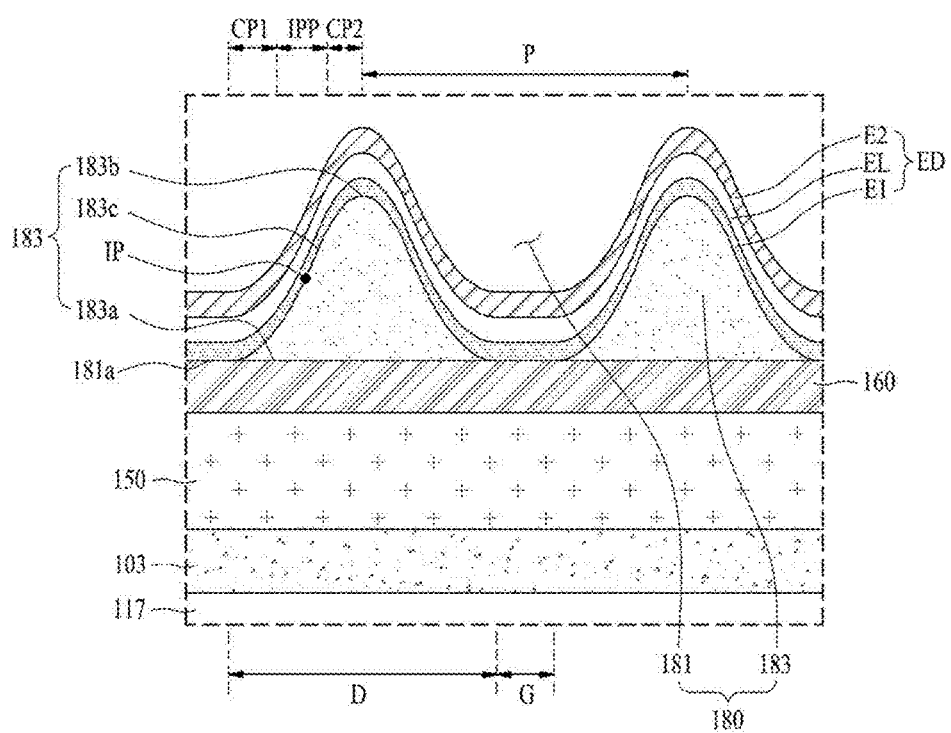
FIG. 9 is a view enlarging a portion B of FIG. 7.

FIG. 9 is a view enlarging a portion B of FIG. 7. In FIG. 9, it is shown that a structure of furrows 181 of the uneven layer 180 is modified. For the purpose of explanations, the furrows 181 and relevant components are explained below, and explanations of the similar or same parts described above may be omitted.

Referring to FIGS. 7 and 9, the uneven layer 180 includes a plurality of furrows 181 and a wall 183 defining each of the plurality of furrows 181. The uneven layer 180 may be equal to the uneven layer shown in FIGS. 2 to 4, except for the bottom surface 181a of each furrow 181.

The furrows 181 and the wall 183 of the uneven layer 180 may be formed through a selective light-exposure process and a developing process of the second insulating layer 170 using a mask. When an light-exposure amount for the bottom surface 181a of the furrows 181 increases by a misalign due to a deformation of a photo mask in the light-exposure process, the second insulating layer 170 is fully removed at the bottom surface 181a of the furrows 181, and thus the base surface portions 183a of the adjacent walls 183 may be separate at a constant gap G from each other. If the barrier layer 160 is not formed between the uneven layer 180 and the wavelength conversion layer 150 and the gap G is formed between the base surface portions 183a of the adjacent walls 183, the wavelength conversion layer 150 is directly exposed to the furrow 181.

However, in this aspect, since the barrier layer 160 is formed between the uneven layer 180 and the wavelength conversion layer 150, when the gap G is formed between the base surface portions 183a of the adjacent walls 183, the wavelength conversion layer 150 is not directly exposed to the furrow 181 by the barrier layer 160.

Further, since the gap G between the adjacent walls 183 forms the bottom surface 181a of the furrows 181 and the light emitting element ED formed on the bottom surface 181a of the furrows 181 serves as a sub emission region, this configuration does not have a great effect on a light extraction efficiency. Accordingly, whether the gap G is formed or not almost makes no difference of light extraction efficiency of each pixel region.

Thus, a light extraction efficiency can increase by forming the gap G between the adjacent walls 183, and particularly, even though a misalign due to a deformation of a photo mask happens, the uneven layer 180 can be formed without an exposure of the wavelength conversion layer 150, and thus a process margin for the uneven layer 180 can increase.

Figure 10:
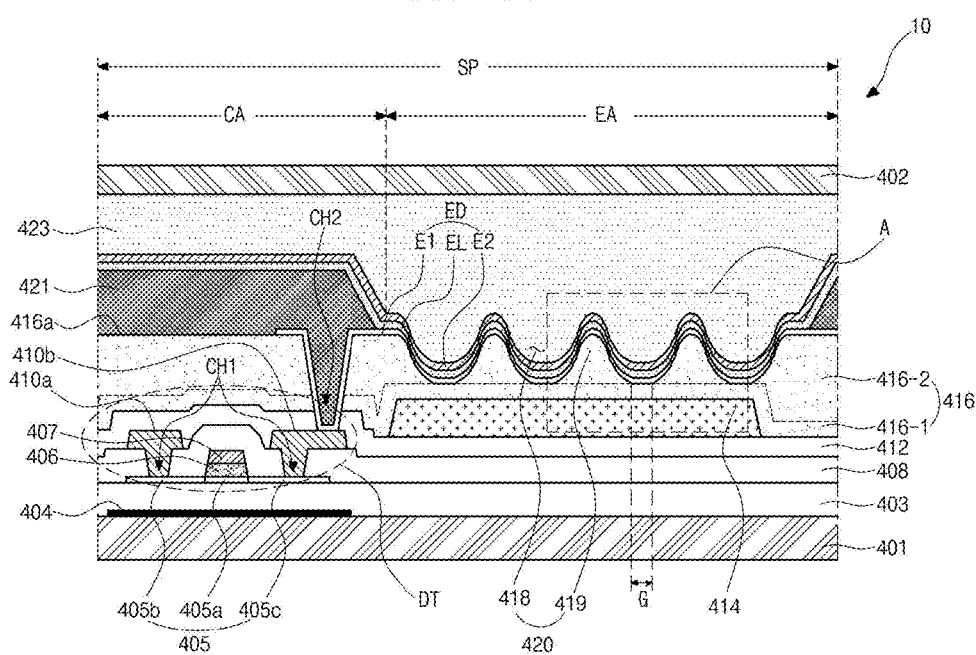
FIG. 10 is a cross-sectional view illustrating a pixel region of a light emitting display device according to a second aspect of the present disclosure.

FIG. 10 is a cross-sectional view illustrating a pixel region of a light emitting display device according to a second aspect of the present disclosure.

The light emitting display device 10 may be a top emission type display device or bottom emission type display device according to a transmission direction (or output direction) of an emitted light. In this aspect, a bottom emission type light emitting display device 10 is described by way of example.

Referring to FIG. 10, the pixel region SP may include a light emission region EA in which a light emitting element ED is formed and through which an image is substantially displayed, and a circuit region CA which is located around edges of the light emission region EA and in which a driving TFT DT is formed.

In the light emitting display device 10, a substrate 401 having the driving TFT DT and a light emitting element ED may be encapsulated by a protection film 402.

An active layer 405 is formed in the circuit region CA. The active layer 405 may be made of silicon, and includes a channel region 405a at a center of the active layer 405, and drain and source regions 405b and 405c that are located at both sides of the channel regions 405a and are highly doped with impurities.

A gate insulating layer 406 is located on the active layer 405.

The gate insulating layer 406 is formed on the channel region 405a of the active layer 405. The gate insulating layer 406 may not be formed over an entire surface of the substrate 401, may be formed in an island shape only on the channel region 405a.

A gate electrode 407 is formed on the gate insulating layer 406 corresponding to the channel region 405a, and even though not shown in the drawings, a gate line extending along a direction is formed on the gate insulating layer 406.

A passivation layer 408 is formed on the gate electrode 407 and the gate line. In the passivation layer 408, first and second contact holes (or first and second active layer contact holes) CH1 are formed to expose the drain and source regions 405b and 405c, respectively.

A drain electrode 410a and a source electrode 410b are formed on the passivation layer 408, and contact the drain region 405b and the source region 405c through the first and second contact holes CH1, respectively.

A first insulating layer 412 is located on the drain and source electrodes 410a and 410b and the passivation layer 408 exposed between the drain and source electrodes 410a and 410b.

The drain and source electrodes 410a and 410b, the active layer 405, the gate insulating layer 406 on the active layer 405, and the gate electrode 407 form the driving TFT DT.

Even though not shown in the drawings, a data line crossing the gate line to define the pixel region SP is formed at the same layer as the drain and source electrodes 410a and 410b, and a switching TFT may have the same structure as the driving TFT DT and be connected to the driving TFT DT.

The driving TFT DT and the switching TFT are described to have a top gate type with a polycrystalline silicon or oxide semiconductor material by way of example. Alternatively, the driving TFT DT and the switching TFT may have a bottom gate type with amorphous silicon.

The substrate 401 may be usually formed of a glass material, and alternatively, may be formed of a transparent plastic material having a bendable or flexible property, for example, polyimide material. In case that the plastic material is used for the substrate 401, considering that a deposition at high temperature is conducted, polyimide having an excellent heat-resisting property may be used. an entire surface of the substrate 401 may be covered by at least one buffer layer 403.

The driving TFT DT may have a property of a threshold voltage being shifted by a light, and to prevent this, the light emitting display device 10 of this aspect may further include a light shielding layer 404 located below the active layer 405.

The light shielding layer 404 is formed between the substrate 401 and the active layer 405 and shields the active layer 405 from a light incident toward the active layer 405 through the substrate 401, and thus a threshold voltage change of a TFT by an external light is prevented. The light shielding layer 404 may be covered by the buffer layer 403.

A wavelength conversion layer 414 is located on the first insulating layer 412 corresponding to the light emission region EA of each pixel region SP.

In other words, the wavelength conversion layer 414 is supported by the first insulating layer 412 and is covered by a second insulating layer 416 so that the wavelength conversion layer 414 is located between the first insulating layer 412 and an uneven layer 420 and overlaps the light emitting element ED.

The wavelength conversion layer 414 may include a color filter that transmits a wavelength of a color light, which is set (or defined) at its pixel region SP, out of a white light emitted from the light emitting element ED toward the substrate 401.

Alternatively, the wavelength conversion layer 414 may transmits a wavelength of red, green or blue. For example, in the light emitting display device 10, one unit pixel may consist of neighboring first to third pixel regions SP, and in this case, a wavelength conversion layer 414 of the first pixel region may include a red color filter, a wavelength conversion layer 414 of the second pixel region may include a green color filter, and a wavelength conversion layer 414 of the third pixel region may include a blue color filter.

Further, in the light emitting display device 10, one unit pixel may include a white pixel region that has no wavelength conversion layer.

Alternatively, the wavelength conversion layer 414 may include a quantum dot that has a size to re-emit according to a white light emitted from the light emitting element ED toward the substrate 401 and output a light of a color set at its pixel region SP. The quantum dot may be formed of CdS, CdSe, CdTe, ZnS, ZnSe, CdZnSeS, GaAs, GaP, GaAs—P, Ga—Sb, InAs, InP, InSb, AlAs, AlP or AlSb.

For example, a wavelength conversion layer 414 of a first pixel region may include a quantum dot of CdSe or InP, a wavelength conversion layer 414 of a second pixel region may include a quantum dot of CdZnSeS, a wavelength conversion layer 414 of a third pixel region may include a quantum dot of ZnSe. The light emitting display device 10 using the wavelength conversion layer 414 with a quantum dot can have a high color reproduction range.

Alternatively, the wavelength conversion layer 414 may be formed of a color filter containing a quantum dot.

The second insulating layer 416 is formed on the wavelength conversion layer 414. The second insulating layer 416 has a drain contact hole CH2, which exposes the source electrode 410b, along with the first insulating layer 412.

The uneven layer 420 may be located at an upper portion of the second insulating layer 416, and changes a traveling path of a light emitted from the light emitting element ED, and thus increases a light extraction efficiency of the pixel region SP.

The uneven layer 420 includes a plurality of furrows 418 located between the light emitting element ED and the wavelength conversion layer 414. In other words, the uneven layer 420 may include a plurality of furrows 418 and a wall 419.

Each of the plurality of furrow 418 is formed concavely from a front surface (or top surface) 416a of the second insulating layer 416. With respect to the front surface 416a of the second insulating layer 416, each of the plurality of furrows 418 may have the same depth.

A bottom surface (or lowest surface) of each furrow 418 is separate at a predetermined distance from the wavelength conversion layer 414. In order that a front surface of the wavelength conversion layer 414 being directly exposed to the furrows 418 due to the depth of the furrows 418 is prevented, a shortest distance from the bottom surface of the furrows 418 to the wavelength conversion layer 414 may be 0.1 um or greater.

In this case, the second insulating layer 416 between the bottom surface of the furrows 418 and the wavelength conversion layer 414 may have a thickness of 0.1 um or greater.

In case that the second insulating layer 416 between the bottom surface of the furrows 418 and the wavelength conversion layer 414 has a thickness less than 0.1 um, in a patterning process for the uneven layer 420, a part of the wavelength conversion layer 414 may be directly exposed to the furrow 418, and thus a property of the light emitting element ED formed on the uneven layer 420 may be deteriorated.

The wall 419 may have a structure to define or surround each furrow 418. The wall 419 changes a traveling path of a light from the light emitting element ED toward substrate 401 and increases an extraction efficiency of a light from the light emitting element ED.

Figure 11:
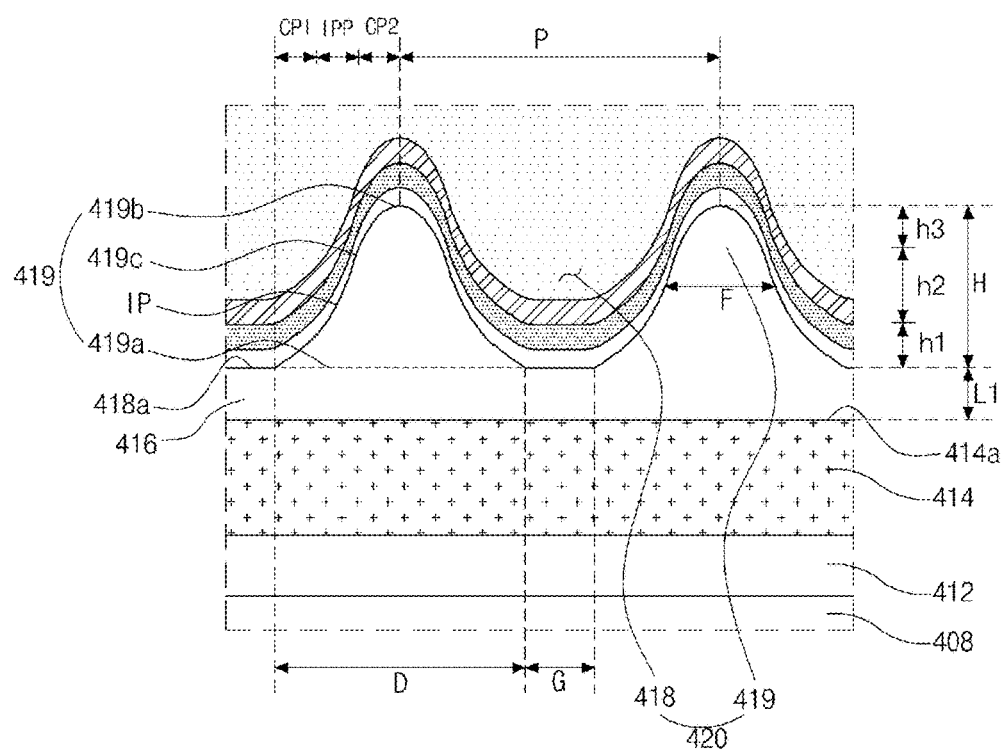
FIG. 11 is a view enlarging a portion A of FIG. 10.

The wall 419 may include a base surface portion (419a of FIG. 11), a top portion (419b of FIG. 11), and a side surface portion (419c of FIG. 11). In the uneven layer 420 of this aspect, the base surface portions of the adjacent walls 419 are separate at a gap G from each other.

In case that the gap G is formed between the adjacent walls 419, even though a misalign due to a deformation of a photo mask happens when forming the furrows 418, the uneven layer 420 can be formed without an exposure of the wavelength conversion layer 414, and thus a process margin for the uneven layer 420 can increase.

In the light emitting display device 10 of this aspect, since an optimum condition for the uneven layer 420 with the gap G is provided, an extraction efficiency of a light emitted from the light emitting element ED can be further improved. This is explained below in detail.

A first electrode E1 is located on the uneven layer 420. The first electrode E1 is connected to the source electrode 410b of the driving TFT DT, and may be made of a material having a relatively high work function and serve as an anode.

For example, the first electrode E1 may be made of a metal oxide material such as ITO or IZO, a mixture of a metal and an oxide material such as ZnO:Al and $SnO_2$:Sb, or a conductive polymer such as Poly(3-methylthiophene), Poly[3,4-(ethylene-1,2)-thiophene] (PEDT), polypyrrole and polyaniline. Alternatively, the first electrode E1 may be formed of a carbon nano tube (CNT), graphene, or a silver nano wire.

The first electrode E1 is located at each pixel regions SP, and a bank 421 is located between the adjacent first electrodes E1. In other words, the first electrodes E1 are separate from each other with the bank 421 as a boundary portion of each pixel region SP.

A light emitting layer EL e.g., an organic light emitting layer EL is located on the first electrode E1, and further the organic light emitting layer EL may be located on the bank 421. The organic light emitting layer EL may be formed with a single layer made of an emitting material, and alternatively, the organic light emitting layer EL may be formed with a multiple layers that may include a hole injection layer, a hole transport layer, an emitting material layer, an electron transport layer and an electron injection layer.

A second electrode E2 is located on the organic light emitting layer EL and may serve as a cathode.

The second electrode E2 may be made of a material having a relatively low work function. The second electrode E2 may be formed with a single layer or multiple layers using a first metal such as Ag and a second metal such as Mg, and the single layer may be made of an alloy of the first and second metals at a predetermined ratio thereof.

When the first electrode E1 and the second electrode E2 are applied with respective voltages, a hole from the first electrode E1 and an electron from the second electrode E2 are transported to the organic light emitting layer EL and form an exciton, and when a transition of the exciton from an excited state to a ground state happens, a light is produced and emitted.

The emitted light passes through the first electrode E1 and travels to the outside, and thus the light emitting display device 10 displays an image.

All of the first electrode E1, the organic light emitting layer EL and the second electrode E2 are formed along the furrow 418 and the wall 419 of the uneven layer 420 and have a shape according to the shape of the uneven layer 420.

The protection film 402 in a thin film type is formed on the driving TFT DT and the light emitting element ED with an encapsulation layer 423 therebetween, and thus the light emitting display device 10 is encapsulated.

The encapsulation layer 423 is formed on the substrate 401 to cover the second electrode E2 i.e., to cover all pixel regions SP. The encapsulation layer 423 protects the driving TFT DT and the light emitting element ED from an external impact, and prevents moisture permeating the light emitting element ED.

Further, the light emitting display device 10 of this aspect may include a polarizing plate (or polarizing film) on a surface, through which an emitted light transmits, of the substrate 401 to prevent a reduction of contrast due to an external light.

In other words, the polarizing plate is located at the light-emitting surface and prevents an external light, which is reflected inside the display device 10, from going back to the outside, and thus the contrast can be improved.

In the light emitting display device 10 of this aspect, by the uneven layer 420 at the light emission region EA of the pixel region SP, a traveling path of a light from the light emitting element ED changes thus a light extraction efficiency can be improved, and thus a brightness can be improved and a power consumption can be reduced.

Further, since a shortest distance between the uneven layer 420 and the wavelength conversion layer 414 is set to be 0.1 um or greater, the wavelength conversion layer 414 being exposed directly to the furrow 418 can be prevented, and thus a property degradation of the light emitting element ED can be prevented.

Particularly, since an optimum condition for the uneven layer 420 with the gap G is provided, an extraction efficiency of a light emitted from the light emitting element ED can be further improved.

FIG. 11 is a view enlarging a portion A of FIG. 10 to explain a cross-sectional structure of the uneven layer of this aspect.

Figure 12:
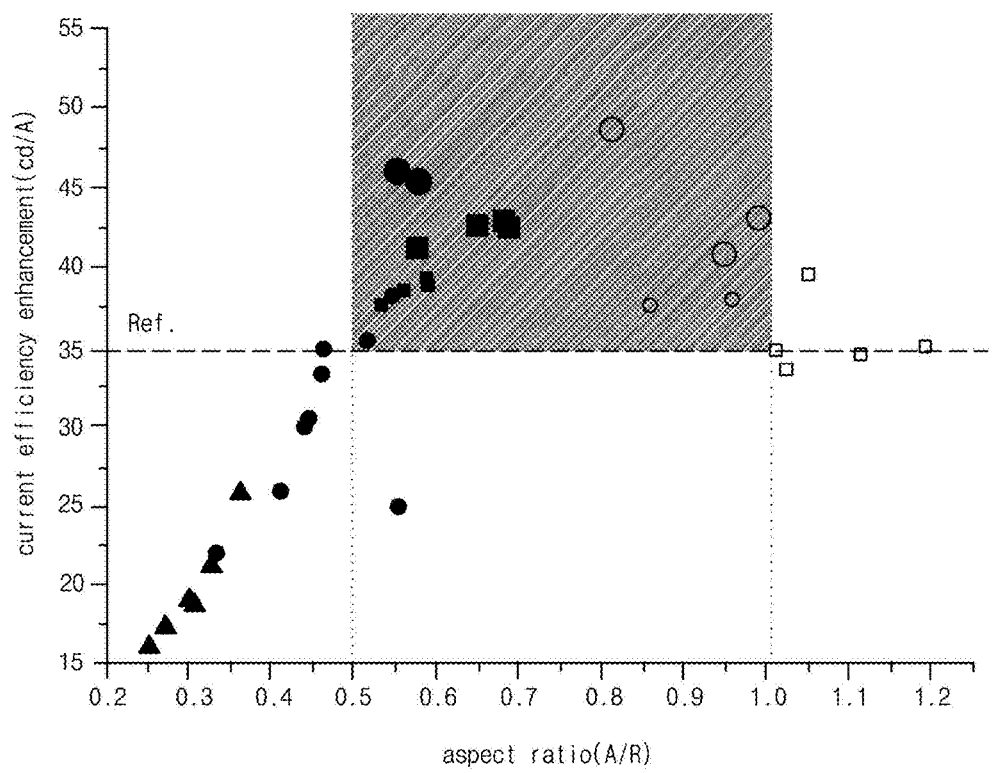
FIG. 12 is a graph illustrating a relation between an aspect ratio and a current efficiency enhancement for various aspect ratios of a wall.
Figure 13:
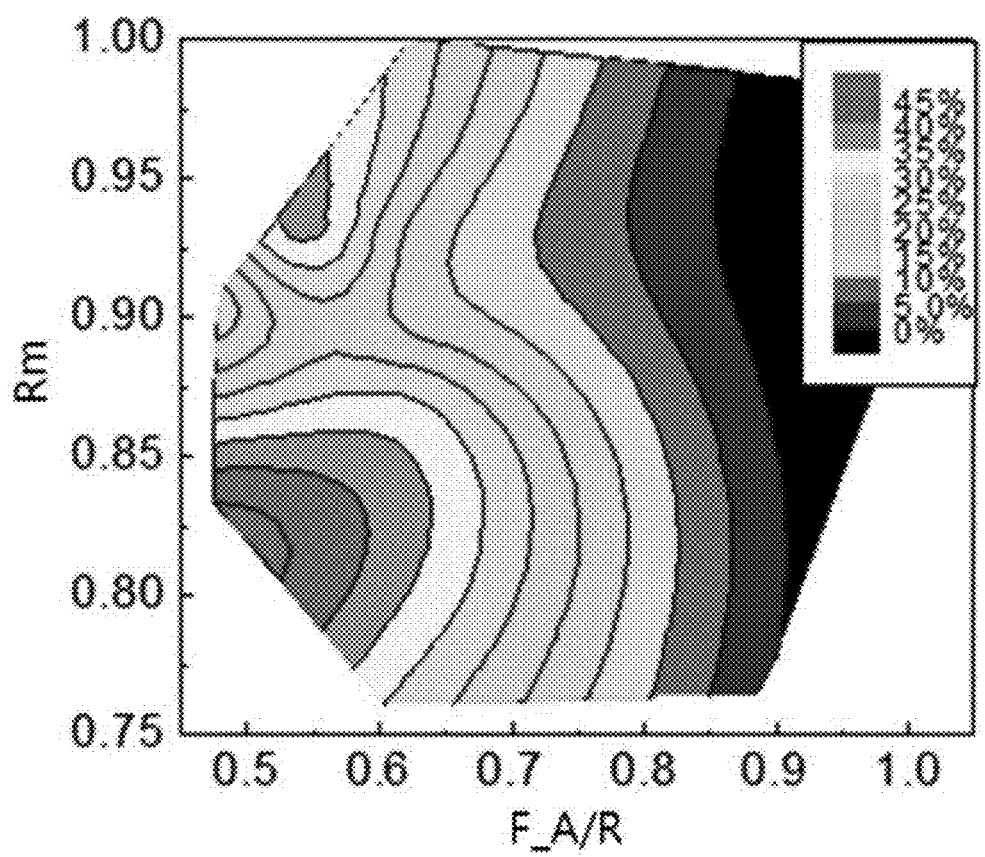
FIG. 13 is a graph illustrating a brightness efficiency according to a relation between an aspect ratio at half maximum and an aspect ratio at half maximum over an aspect ratio of a wall.

FIG. 12 is a graph illustrating a relation between an aspect ratio A/R and a current efficiency enhancement for various aspect ratios of a wall. FIG. 13 is a graph illustrating a brightness efficiency according to a relation between an aspect ratio at half maximum F_AR and an aspect ratio at half maximum over an aspect ratio Rm of a wall.

Referring to FIG. 11, the uneven layer 420 includes a plurality of furrows 418 and a wall 419 defining each furrow 418.

Each of the plurality of furrows 418 are provided concavely from a front surface 416a of the second insulating layer 416 to have a regular interval, and may be referred to as a concave portion or dent portion.

The furrows 418 may substantially have the same depth with respect to the front surface 416a of the second insulating layer 416. A bottom surface (or lowest surface) 418a of each furrow 418 is separate at a predetermined distance from the wavelength conversion layer 414.

In other words, the bottom surface 418a of the furrow 418 faces a front surface 414a of the wavelength conversion layer 414 with the second insulating layer 416 therebetween. The second insulating layer 416 located between the bottom surface 418a of the furrows 418 and the wavelength conversion layer 414 may have a thickness of 0.1 um or greater in order that a part of the front surface 414a of the wavelength conversion layer 414 being directly exposed to the furrows 418 when forming the furrows 418 is prevented.

When forming the furrows 418, as the second insulating layer 416 between the bottom surface 418a of the furrows 418 and the wavelength conversion layer 414 increases in thickness, a part of the front surface 414a of the wavelength conversion layer 414 being directly exposed to the furrows 418 is effectively prevented, but in terms of a manufacturing process, a material cost and a process time of the second insulating layer 416 and a thickness of the light emitting display device increases.

Accordingly, in order that the front surface 414a of the wavelength conversion layer 414 being directly exposed to the furrows 418 due to the depth of the furrows 418 is prevented and also an increase of a material cost and a process time of the second insulating layer 416 and a thickness of the light emitting display device is minimized, a maximum thickness of the second insulating layer 416 between the bottom surface 418a of the furrow 418 and the wavelength conversion layer 414 may be set to be 3 um or less.

Thus, among the plurality of furrows 418, a shortest distance L1 from the front surface 414a of the wavelength conversion layer 414 may be 0.1 um, and a longest distance from the front surface 414a of the wavelength conversion layer 414 may be 3 um. As a result, a distance L1 between the bottom surface 418a of each furrow 418 and the front surface 414a of the wavelength conversion layer 414 may be in a range of 0.1 um to 3 um.

In case that the shortest distance L1 is less than 0.1 um, in a patterning process for the uneven layer 420, a part of the front surface 414a of the wavelength conversion layer 414 may be removed thus dented, or may be directly exposed to the furrow 418.

In cast that the wavelength conversion layer 414 is not covered by the second insulating layer 416 and is exposed to the furrow 418, a dark spot defect happens at a dented portion of the wavelength conversion layer 414, a moisture or the like by an outgassing of the wavelength conversion layer 414 is diffused to the light emitting element ED thus property, reliability and lifetime of the light emitting element ED is reduced, the first electrode E1 is deteriorated due to the first electrode E1 directly contacting the wavelength conversion layer 414, and the wavelength conversion layer 414 is damaged by the deterioration of the first electrode E1.

Thus, in case that the wavelength conversion layer 414 is not covered by the second insulating layer 416 and is exposed to the furrow 418, light emission property and lifetime of the light emitting display device may be reduced.

In this aspect, in terms of a manufacturing process, considering a material cost and a process time of the second insulating layer 416 and the like, the second insulating layer 416 is formed with a first layer (or first sub layer) 416-1 and a second layer (or second sub layer) 416-2 in order to secure the shortest distance L1 between the furrows 418 and the front surface 414a of the wavelength conversion layer 414.

In other words, using the same organic insulating material, the second insulating layer 416 is configured with a double-layered structure that has two layers, formed sequentially, of different thicknesses.

The first layer 416-1 is formed to cover the first insulating layer 412 and the wavelength conversion layer 414 and serves as an exposure prevention layer or sacrificial layer to prevent an exposure of the wavelength conversion layer 414.

The first layer 416-1 is formed to have a thickness of 0.1 um to 3 um thus separate the bottom surface 418a of each furrow 418 from the front surface 414a of the wavelength conversion layer 414 at a distance of 0.1 um to 3 um. Accordingly, when forming the uneven layer 420, the front surface 414a of the wavelength conversion layer 414 being exposed directly to the furrow 418 is prevented.

The second layer 416-2 is formed to entirely cover the first layer 416-1 and have a thickness greater than that of the first layer 416-1. The second layer 416-2 provides a planarization layer on the first layer 416-1 of the circuit region CA and the light emission region EA. For example, the second layer 416-2 has a thickness equal to or greater than a depth of the furrow 418 or a height H of the wall 419.

The second insulating layer 416 structurally includes the first layer 416-1 and the second layer 416-2 in order to prevent an exposure of the front surface 414a of the wavelength conversion layer 414. However, the first layer 416-1 is formed through a first deposition process and a first hardening process using an organic material, and then the second layer 416-2 is formed through a second deposition process and a second hardening process using the same organic material.

Accordingly, a boundary portion between the first layer 416-1 and the second layer 416-2 of the double-layered structure formed on the circuit region CA of the substrate 401 may be not structurally distinguished.

The wall 419 surrounds each furrow 418 to define each furrow 418, and may have a structure protruded in a convex shape on the wavelength conversion layer 414.

Accordingly, the wall 419 may have a cross-sectional structure of a convex lens shape or micro lens shape. The wall 419 changes a traveling path of a light, which is emitted from the light emitting element ED and is incident to the wall 419, toward the substrate 401, and thus a light extraction efficiency of the pixel region SP increases.

The wall 419 may have a hexagonal band shape in a plan view. One furrow 418 may be placed in the hexagonal band shaped wall 419. Accordingly, the furrows 418 and the wall 419 on the light emission region EA form a honeycomb structure of a hexagonal shape in a plan view. However, in this aspect, the wall 419 defining one furrow 418 may have a various shape in a plan view, for example, a circular band shape, an oval band shape, or a polygonal band shape.

The wall 419 has a cross-sectional area that is alongside of (or parallel to) the wavelength conversion layer 414. In order to change a traveling path of an incident light and increase a light extraction efficiency, the cross-sectional area of the wall 419 may become greater as the cross-section area may become closer to the wavelength conversion layer 414. In other words, the wall 419 may decrease in width in an upward direction (i.e., in a direction from the substrate 401 to the light emitting element ED).

The wall 419 may include a base surface portion 419a, a top portion 419b, and a side surface portion 419c.

The base surface portion 419a may be defined as a bottom surface of the wall 419 close to the wavelength conversion layer 414. In other words, the base surface portion 419a may be defined as a contact surface between the first layer 416-1 overlapping the wavelength conversion layer 414 and the wall 419, or a bottom surface of the wall 419 contacting the front surface of the first layer 416-1.

The base surface portion 419a of the wall 419 is separate from adjacent (or neighboring) base surface portion 419a to form the gap G, and in this case, the bottom surface 418a of the furrow 418 may be the second layer 416-1 exposed between the adjacent base surface portions 419a.

A pitch between the adjacent walls 419 is set greater than a diameter (or width) D of the base surface portion 419a, and the base surface portions 419a of the adjacent walls 419 are separate at the gap G from each other.

In case that the gap G is formed between the adjacent walls 419, when forming the furrow 418, even though a misalign due to a deformation of a photo mask happens, the uneven layer 420 can be formed without an exposure of the wavelength conversion layer 414, and thus a process margin for the uneven layer 420 can increase.

The top portion 419b is separate at a predetermined height from the base surface portion 419a. The top portion 419b may be defined as a peak of the wall 419 having a convex shape. The top portion 419b may be located at the front surface 416a of the second insulating layer 416 or located below the front surface 416a.

The side surface portion 419c is located between the base surface portion 419a and the top portion 419b.

The side surface portion 419c may be formed in a curved shape between the base surface portion 419a and the top portion 419b in order to change a traveling path of an incident light thus increase a light extraction efficiency of the pixel region SP. The side surface portion 419c may have a curve shape with an inflection point IP in order to maximize a light extraction efficiency of the pixel region SP.

In this case, the side surface portion 419c may include an inflection portion IPP including the inflection point IP, a first curved portion CP1 between the inflection portion IPP and the base surface portion 419a, and a second curved portion CP2 between the inflection portion IPP and the top portion 419b.

The inflection portion IPP may include a concave portion between the inflection point IP and the first curved portion CP1 and a convex portion between the inflection point IP and the second curved portion CP2. Accordingly, a traveling path of a light incident on the inflection portion IPP can change at various angles by each of the concave portion and the convex potion, and thus a light extraction efficiency of the pixel region SP can be improved.

The first curved portion CP1 may be formed in a concave shape between the inflection portion IPP and the base surface portion 419a. The second curved portion CP2 may be formed in a convex shape between the inflection portion IPP and the top portion 419b.

Accordingly, regarding the side surface portion 419c of the wall 419, as a ratio occupied by the inflection portion IPP is greater, a light extraction efficiency may be greater, and as a ratio occupied by the first curved portion CP1 is less, a power consumption may be less.

Thus, since the wall 419 is configured such that a ratio (h1:h2:h3) the height h1 of the first curved portion CP1, the height h2 of the inflection portion IPP and the height h3 of the second curved portion CP2 is set as 1:3:1 with respect to the height H of the wall 419, a light extraction efficiency can increase.

The curved length of the second portion CP2 may be greater than that of the first curved portion CP1. The heights h1, h2 and h3 and the curved lengths of the first curved portion CP1, the inflection portion IPP and the second curved portion CP2 may be determined according to the aspect ratio (A/R) of the wall 183 that is determined to improve a light extraction efficiency according to a change of a light traveling path.

The inflection portion IPP, the first curved portion CP1 and the second curved portion CP2 of the side surface portion 419c may have a symmetrical structure with respect to the top portion 419b, and thus the wall 419 may have a bell or Gaussian curve cross-sectional structure.

Alternatively, the side surface portion 419c may have a concave or convex curved shape such that the side surface portion 419c has any curvature between the base surface portion 419a and the top portion 419b.

A light traveling path change due to the shape of the wall 419 causes an improvement of a light extraction efficiency, and variables (or factors) to determine the shape may include a diameter D, a height H, an aspect ratio A/R, a full width at half maximum F, an aspect ratio at half maximum F_A/R, a slope S, a gap G, and an aspect ratio at half maximum over an aspect ratio Rm regarding the wall 419.

The aspect ratio A/R is defined as a following formula 1.

$$A/R = H/(D/2).$$  Formula 1

In other words, the aspect ratio A/R is the height H divided by half the diameter D/2.

In this aspect, according to forming the gap G between the adjacent walls 419, the aspect ratio A/R of the wall 419 is set in a range of 0.5 to 1.0.

In this regard, the gap G between the base surface portions 419a of the adjacent walls 419 may be in a range of 0.3 um to 1.0 um.

In other words, when the gap G may be in a range of 0.3 um to 1.0 um, in case that the aspect ratio A/R is below 0.5, the height H of the wall 419 is very low, thus an incident light from the light emitting element ED does not travel to the substrate 401 but is trapped in the light emitting element ED, and thus a light extraction efficiency is reduced.

In case that the aspect ratio is over 1.0, the height H of the wall 419 is very high, thus an incident light from the light emitting element ED does not travel to the substrate 401 but is trapped in the wall 419, and thus a light extraction efficiency is reduced.

Particularly, in case that the aspect ratio is over 1.0, there is a tendency for a current efficiency enhancement of the light emitting element ED to be reduced, and in case that the aspect ratio is in a range of 0.5 to 1.0, a current efficiency enhancement of the light emitting element ED becomes a maximum value.

Thus, it is preferable that the aspect ratio of the wall 419 is set in a range of 0.5 to 1.0 in order to maximize a light extraction efficiency of the pixel region SP.

In FIG. 12, a current efficiency enhancement being greater means a light emission efficiency being better.

Referring to FIG. 12, when an aspect ratio A/R of the wall 419 is set in a range of 0.5 to 1.0, a current efficiency enhancement is high with 35 cd/A or greater.

However, even when an aspect ratio A/R as one variable to define a shape of the wall 419 is equal but other variables such as a full width at half maximum F of the wall 419, a gap G between the walls 419 and the like alters, a shape of the wall 419 alters.

Accordingly, in this aspect, an aspect ratio at half maximum F_A/R of the wall 419 is set in a range of 0.4 to 0.8, and an aspect ratio at half maximum F_A/R over an aspect ratio A/R, Rm of the wall 419 is set in a range of 0.7 to 1.0. Further, a slope S of the wall is set in a range of 40 to 80 degrees.

The aspect ratio at half maximum F_A/R is defined as a following formula 2.

$$F\_AR=(H/2)/(F/2)=H/F.$$ Formula 2

In other words, the aspect ratio at half maximum F_A/R is an aspect ratio for a full width at half maximum (i.e., half height) F of the wall 419.

In case that the aspect ratio at half maximum F_A/R is below 0.4, the height H of the wall 419 is very low, thus an incident light from the light emitting element ED does not travel to the substrate 401 but is trapped in the light emitting element ED, and thus a light extraction efficiency is reduced.

In case that the aspect ratio at half maximum F_A/R is over 0.8, the height H of the wall 419 is very high, thus an incident light from the light emitting element ED does not travel to the substrate 401 but is trapped in the wall 419, and thus a light extraction efficiency is reduced.

Particularly, in case that the aspect ratio at half maximum F_A/R is over 0.8, there is a tendency for a current efficiency enhancement of the light emitting element ED to be reduced, and in case that the aspect ratio at half maximum F_A/R is in a range of 0.4 to 0.8, a current efficiency enhancement of the light emitting element ED becomes a maximum value.

Thus, it is preferable that the aspect ratio at half maximum F_A/R of the wall 419 is set in a range of 0.4 to 0.8 in order to maximize a light extraction efficiency of the pixel region SP.

An aspect ratio at half maximum F_A/R over an aspect ratio A/R, Rm of the wall 419 is defined as a following formula 3.

$$Rm=(F\_A/R)/(A/R)=D/2F.$$ Formula 3

In other words, an aspect ratio at half maximum F_A/R over an aspect ratio A/R, Rm is the aspect ratio at half maximum F_A/R divided by the aspect ratio A/R.

In case that the Rm is below 0.7, the height H of the wall 419 is very low, thus an incident light from the light emitting element ED does not travel to the substrate 401 but is trapped in the light emitting element ED, and thus a light extraction efficiency is reduced.

In case that the Rm is over 1.0, the height H of the wall 419 is very high, thus an incident light from the light emitting element ED does not travel to the substrate 401 but is trapped in the wall 419, and thus a light extraction efficiency is reduced.

Further, in case that the Rm is over 1.0, there is a tendency for a current efficiency enhancement of the light emitting element ED to be reduced, and in case that the Rm is in a range of 0.7 to 1.0, a current efficiency enhancement of the light emitting element ED becomes a maximum value.

Thus, it is preferable that the Rm of the wall 419 is set in a range of 0.7 to 1.0 in order to maximize a light extraction efficiency of the pixel region SP.

Referring to FIG. 13, it is seen that when the Rm is in a range of 0.7 to 1.0 and the F_A/R is in a range of 0.4 to 0.8, a brightness efficiency for a white is very high.

A slope S may mean a slope of a maximum angle between a tangent line to the base surface portion 419a and a horizontal plane.

Since a case of the slope S below 40 degrees is not very different in a light traveling angle from a case of no wall 419 being formed, the case of the slope S below 40 degrees almost has no efficiency improvement. In a case of the slope S over 80 degrees, a light traveling angle may be greater than a total reflection angle between the substrate 401 and an air outside the substrate 401, and thus an amount of a light trapped in the light emitting element ED may greatly increase.

Thus, it is preferably that the slope S of the wall is set in a range of 40 to 80 degrees in order to maximize a light extraction efficiency of the pixel region SP.

In this aspect, according to forming the gap G between the adjacent walls 419, by setting the aspect ratio A/R of the wall 419 in a range of 0.5 to 1.0, the aspect ratio at half maximum F_AR of the wall 419 in a range of 0.4 to 0.8, the aspect ratio at half maximum over the aspect ratio, Rm of the wall 419 in a range of 0.7 to 1.0, and the slope S of the wall in a range of 40 to 80 degrees, an optimum condition to maximize a light extraction efficiency is obtained.

In this regard, the gap G may be in a rage of 0.3 um to 10 um.

Further, the full width at half maximum F may be set in a range 1 um to 2.5 um. In case that the full width at half maximum F is below 1 um or over 2.5 um, a light extraction efficiency by the wall 419 may be reduced.

In other words, in case that the full width at half maximum F of the wall 419 is below 1 um, an amount of a light, from the light emitting element ED, reflected by the wall 419 and then extracted to the substrate 401 is less than an amount of a light diffuse reflected at the wall 419, thus an amount of a light trapped in the light emitting element ED increases and thus a light extraction efficiency may be reduced.

Particularly, a light, which has an incidence angle less than a critical angle of a total reflection, out of a light emitted from the light emitting element ED may be extracted to the outside of the substrate 401 through a multiple reflection between the side surface portions 419c of the wall 419. In case that the full width at half maximum F of the wall 419 exceeds 2.5 um, an amount of a light reflected between the side surface portions 419c is reduced and thus an amount of a light output to the outside of the substrate 401 is reduced.

In this aspect, the second insulating layer 416 formed with the first and second layers 416-1 and 416-2 on the wavelength conversion layer 414 is explained by way of example. Alternatively, a barrier layer may replace the first layer 416-1 to be formed on the wavelength conversion layer 414, similarly to the aspect of FIGS. 7 to 9.

The barrier layer serves as an etch stopper on the wavelength conversion layer 414 when forming the uneven layer 420, thus the wavelength conversion layer 414 being exposed directly to the furrow 418 is prevented, and thus a problem by an exposure of the wavelength conversion layer 414 is fundamentally prevented.

The barrier layer may have a thickness that corresponds to the shortest distance L1 between the bottom surface 418a of the furrows 418 and the wavelength conversion layer 414. In other words, the barrier layer may be formed at the thickness of 0.1 um to 3 um to prevent the wavelength conversion layer 414 being exposed to the furrow 418 when forming the uneven layer 420.

The barrier layer may be formed of a material not removed by a developing material (or an etching material) that is used in a patterning process of the second insulating layer 416.

Alternatively, the barrier layer may be formed of an inorganic material, for example, silicon oxide or silicon nitride. In other words, the barrier layer may be formed of the same material as the first insulating layer 412.

According to the above-described aspects of the present disclosure, by employing the uneven layer, an extraction efficiency of a light emitted from the light emitting element can be improved.

Further, the uneven layer can be formed without an exposure of the wavelength conversion layer overlapping the uneven layer, and thus reduction of reliability and lifetime of the wavelength conversion layer due to the exposure of the wavelength conversion layer can be prevented.

It will be apparent to those skilled in the art that various modifications and variations can be made in a display device of the present disclosure without departing from the sprit or scope of the disclosure. Thus, it is intended that the present disclosure covers the modifications and variations of this disclosure provided they come within the scope of the appended claims and their equivalents.

What is claimed is:

1. A light emitting display device comprising:
   a light emitting element including a light emitting layer disposed between a first electrode and a second electrode;
   a wavelength conversion layer overlapping the light emitting element; and
   an uneven layer including a plurality of furrows disposed between the light emitting element and the wavelength conversion layer,
   wherein a bottom surface of the plurality of furrows is separate at a distance from the wavelength conversion layer.

2. The light emitting display device of claim 1, wherein a shortest distance between the bottom surface of the plurality of furrows and the wavelength conversion layer is in a range of 0.1 um to 3 um.

3. The light emitting display device of claim 1, further comprising:
   a circuit region including a thin film transistor connected to the first electrode;
   a first insulating layer that covers the circuit region and supports the wavelength conversion layer; and
   a second insulating layer that covers the first insulating layer and the wavelength conversion layer,
   wherein the uneven layer is formed at the second insulating layer overlapping the wavelength conversion layer.

4. The light emitting display device of claim 3, wherein the second insulating layer between the bottom surface of the plurality of furrows and the wavelength conversion layer has a thickness in a range of 0.1 um to 3 um.

5. A light emitting display device comprising:
   a light emitting element including a light emitting layer;
   a wavelength conversion layer vertically overlapping the light emitting element; a barrier layer covering the wavelength conversion layer;
   a second insulating layer covering the barrier layer,
   an uneven layer including a plurality of furrows disposed between the light emitting element and the wavelength conversion layer, wherein the uneven layer is formed at the second insulating layer overlapping the wavelength conversion layer,
   wherein the barrier layer has a thickness corresponding to a separate distance between the bottom surface of the plurality of furrows and the wavelength conversion layer.

6. The light emitting display device of claim 5, wherein the barrier layer has a thickness in a range of 0.1 um to 3 um.

7. The light emitting display device of claim 5, further comprising
   a circuit region including a thin film transistor electrically connected to the first electrode; and
   a first insulating layer that covers the circuit region and supports the wavelength conversion layer,
   wherein the barrier layer covers the first insulating layer on the circuit region.

8. The light emitting display device of claim 7, wherein the barrier layer is formed of a same material as the first insulating layer.

9. The light emitting display device of claim 1, wherein the uneven layer includes a wall defining each of the plurality of furrows, and
   wherein the wall includes:
   a base surface portion close to the wavelength conversion layer;
   a top portion separate at a predetermined height from the base surface portion; and
   a side surface portion between the base surface portion and the top portion.

10. The light emitting display device of claim 9, wherein a cross-sectional area of the wall parallel to the wavelength conversion layer increases as the cross-sectional area is close to the wavelength conversion layer.

11. The light emitting display device of claim 9, wherein the side surface portion has a curved shape with an inflection point.

12. The light emitting display device of claim 11, wherein each of the first electrode, the light emitting layer and the second electrode has a shape matching a contour of the uneven layer.

13. The light emitting display device of claim 12, wherein the side surface portion includes:
   an inflection portion including the inflection point;
   a first curved portion between the inflection portion and the base surface portion; and
   a second curved portion between the inflection portion and the top portion,
   wherein a thickness of the light emitting element covering the inflection portion is less than that of the light emitting element covering each of the first and second curved portions.

14. The light emitting display device of claim 13, wherein the wall has a height including a height ratio of the first curved portion, the inflection portion and the second curved portion to be 1:3:1.

15. The light emitting display device of claim 13, wherein the wall has an aspect ratio in a range of 0.4 to 0.7.

16. The light emitting display device of claim 13, wherein base surface portions of neighboring walls are separate from each other.

17. The light emitting display device of claim 16, wherein the base surface portions of the neighboring walls are separate at 0.3 um to 10 um, and
   wherein an aspect ratio of the wall is in a range of 0.5 to 1.0.

18. The light emitting display device of claim 17, wherein the wall has an aspect ratio at half maximum in a range of 0.4 to 0.8.

19. The light emitting display device of claim 18, wherein the aspect ratio at half maximum of the wall over the aspect ratio is in a range of 0.7 to 1.0.

20. The light emitting display device of claim 18, wherein a slope of an angle between a tangent line to the base surface portion and a horizontal plane is in a range of 40 to 80 degrees.

* * * * *